(12) United States Patent
Thaler

(10) Patent No.: US 7,440,513 B2
(45) Date of Patent: Oct. 21, 2008

(54) CODING AND DECODING PACKETIZED DATA

(75) Inventor: Patricia A. Thaler, Carmichael, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 609 days.

(21) Appl. No.: 11/136,257

(22) Filed: May 24, 2005

(65) Prior Publication Data

US 2006/0268997 A1   Nov. 30, 2006

(51) Int. Cl.
*H04L 25/03* (2006.01)

(52) U.S. Cl. ............... 375/296; 375/240; 375/285; 714/701; 370/389; 370/474

(58) Field of Classification Search ........ 375/295, 375/140, 141, 146, 296, 285, 240; 341/51, 341/78; 714/701, 752, 758, 779; 370/351, 370/389, 473, 474
See application file for complete search history.

(56) References Cited

U.S. PATENT DOCUMENTS

| 5,022,051 | A | 6/1991 | Crandall et al. |
| 5,438,621 | A | 8/1995 | Hornak et al. |
| 6,192,093 | B1 * | 2/2001 | Lai et al. .............. 375/371 |
| 6,650,638 | B1 | 11/2003 | Walker et al. |
| 6,718,491 | B1 | 4/2004 | Walker et al. |
| 2006/0256875 | A1 * | 11/2006 | McClellan |

* cited by examiner

*Primary Examiner*—Dac V Ha

(57) ABSTRACT

A method for coding a packet of information words into frames for transmission, includes receiving blocks of input data, including control words and the packet of information words. When the block consists exclusively of information words, a master transition having a first sense is scrambled and appended to the block to form one of the frames. When the block does not consist exclusively of information words: the block is condensed to accommodate a TYPE word; a TYPE word having a value that indicates a structural property of the block is generated and inserted into the block; and a master transition having a second sense, opposite to the first sense, is scrambled and appended to the block to form one of the frames.

13 Claims, 14 Drawing Sheets

| TYPE 7 | 1 | 0 | AA (TYPE) | D0:8 | D1:8 | ☒ | Z3:7 | Z4:7 | Z5:7 | Z6:7 | Z7:7 |

Fig. 7G

| TYPE 8 | 1 | 0 | B4 (TYPE) | D0:8 | D1:8 | D2:8 | ☒ | Z4:7 | Z5:7 | Z6:7 | Z7:7 |

Fig. 7H

| TYPE 9 | 1 | 0 | CC (TYPE) | D0:8 | D1:8 | D2:8 | D3:8 | ☒ | Z5:7 | Z6:7 | Z7:7 |

Fig. 7I

| TYPE 10 | 1 | 0 | D2 (TYPE) | D0:8 | D1:8 | D2:8 | D3:8 | D4:8 | ☒ | Z6:7 | Z7:7 |

Fig. 7J

| TYPE 11 | 1 | 0 | E1 (TYPE) | D0:8 | D1:8 | D2:8 | D3:8 | D4:8 | D5:8 | ☒ | Z7:7 |

Fig. 7K

| TYPE 12 | 1 | 0 | FF (TYPE) | D0:8 | D1:8 | D2:8 | D3:8 | D4:8 | D5:8 | D6:8 |

Fig. 7L

CODING AND DECODING PACKETIZED DATA

BACKGROUND

For several decades now, integrated circuit and laser technologies have doubled in performance approximately every 18 months. These technologies have been used to support a rapidly-growing demand for global communications capacity. This demand is currently growing much faster than the underlying rate of improvement of the supporting technologies. As an example, communication traffic through the Internet has recently been doubling every nine months. The demand for additional current bandwidth is severely stressing the capabilities of current electronic and optical technologies.

In particular, the Ethernet local area network standard has progressively increased in speed by factors of ten, starting at 10 megabit per second (Mb/s) in 1982. Proposals for a 10 gigabit/second (Gb/s) Ethernet standard were made in 1999. A prior Ethernet standard used an 8b/10b line code described by A. X. Widmer and P. A. Franaszek in A DC-Balanced, Partitioned-Block, 8b/10b Transmission Code, 27 IBM J. RES. AND DEV., (1983 September) for transmitting serial data at 1 Gb/s. In the 8b/10b line code, each 8-bit input word is represented by a 10-bit code that is transmitted on the data link. In exchange for this 25% overhead, 8b/10b coding provides DC balance, and a guaranteed transition density. The 10-bit code additionally has the ability to represent an assortment of control words used for signaling and framing.

Re-using 8b/10b coding for sending information at 10 Gb/s was considered in the proposed 10 Gb/s Ethernet standard. However, using this technique would result in having to transmit at a baud rate of 12.5 Gbaud, i.e., 12.5 Gb/s.

With currently-available laser fabrication technology, manufacturing a laser capable of modulation at 12.5 Gb/s at a modest price is considered to be quite difficult. However, laser systems currently exist for use in systems conforming to the OC-192 SONET telecommunications standard. Such systems operate at signaling rates of 9.95328 Gb/s. However, these commercially-available lasers do not have enough performance margin to run at more than 25% faster than their design speed.

One way to enable the lasers designed for use in SONET telecommunications systems to be used in the proposed 10 Gb/s Ethernet standard would be to design a simple and robust coding scheme with a lower overhead than 8b/10b line code. In principle, this goal can be achieved using a block code in which words of M bits are represented by an N-bit code and in which the ratio of N:M is less than 10:8.

A potential coding scheme having a lower overhead than 8b/10b line code is that used in the SONET telecommunications standard. The SONET coding scheme assures DC balance by using a scrambling system, and has an overhead of about 3%. However, the scrambling system used in the SONET coding scheme uses two layers of polynomial scrambling to achieve an adequate level of protection. This two-layer scheme is complex to implement. Moreover, the SONET coding scheme has a complex framing protocol that is difficult to implement at low cost. The SONET coding scheme would also have to be modified to add an extra level of encoding to support Ethernet packet delimiting. Such an extra level of coding would probably increase the overhead of the SONET coding to 7% or more. In addition, it is thought that the networking community would find the wholesale adoption of a telecommunications standard to be unpalatable.

The performance and political difficulties just described would make it difficult for a standard based on the SONET coding scheme to be adopted as a new Ethernet standard.

Another potential coding scheme having a lower overhead than 8b/10b line code is that known as CIMT. This coding scheme is described in U.S. Pat. No. 5,022,051 of Crandall et al. and U.S. Pat. No. 5,438,621 of Hornak et al. The CIMT code is an (M)b/(M+4)b code that can be configured to have a lower overhead than 8b/10b line code by making the value of M sufficiently large. However, for large values of M, the CIMT code is difficult to implement due to the need to compute the DC balance of an incoming block of M bits, and the need to compute a running DC balance of the transmitted bits in real time.

U.S. Pat. Nos. 6,718,491 and 6,650,638, which are assigned to the same assignee as the present disclosure, disclose a 64b/66b coding scheme that addresses the problems identified above. In the disclosed coding scheme, a 2-bit "master transition" is appended to each block of data to form a frame. When either all control information, or all data, is being transmitted, the master transition is a constant value, and the resulting periodic signal causes undesirable spectral peaks in the frequency domain.

SUMMARY

One form of the present invention provides a method for coding a packet of information words into frames for transmission. The method includes receiving blocks of input data, the input data including control words and the packet of information words, the packet having a start preceded by ones of the control words and an ending followed by others of the control words, the blocks being smaller than the packet. The method includes determining when a block consists exclusively of information words. When the block consists exclusively of information words, a master transition having a first sense is scrambled and appended to the block to form one of the frames. When the block does not consist exclusively of information words: the block is condensed to accommodate a TYPE word; a TYPE word having a value that indicates a structural property of the block is generated and inserted into the block; and a master transition having a second sense, opposite to the first sense, is scrambled and appended to the block to form one of the frames.

BRIEF DESCRIPTION OF THE DRAWINGS

FIGS. 7A-7L show specific examples of the frames generated from each of the twelve block types shown in FIGS. 3A-3D, including the master transition and the TYPE word, where used, according to one embodiment of the invention.

DETAILED DESCRIPTION

In the following Detailed Description, reference is made to the accompanying drawings, which form a part hereof, and in which is shown by way of illustration specific embodiments in which the invention may be practiced. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
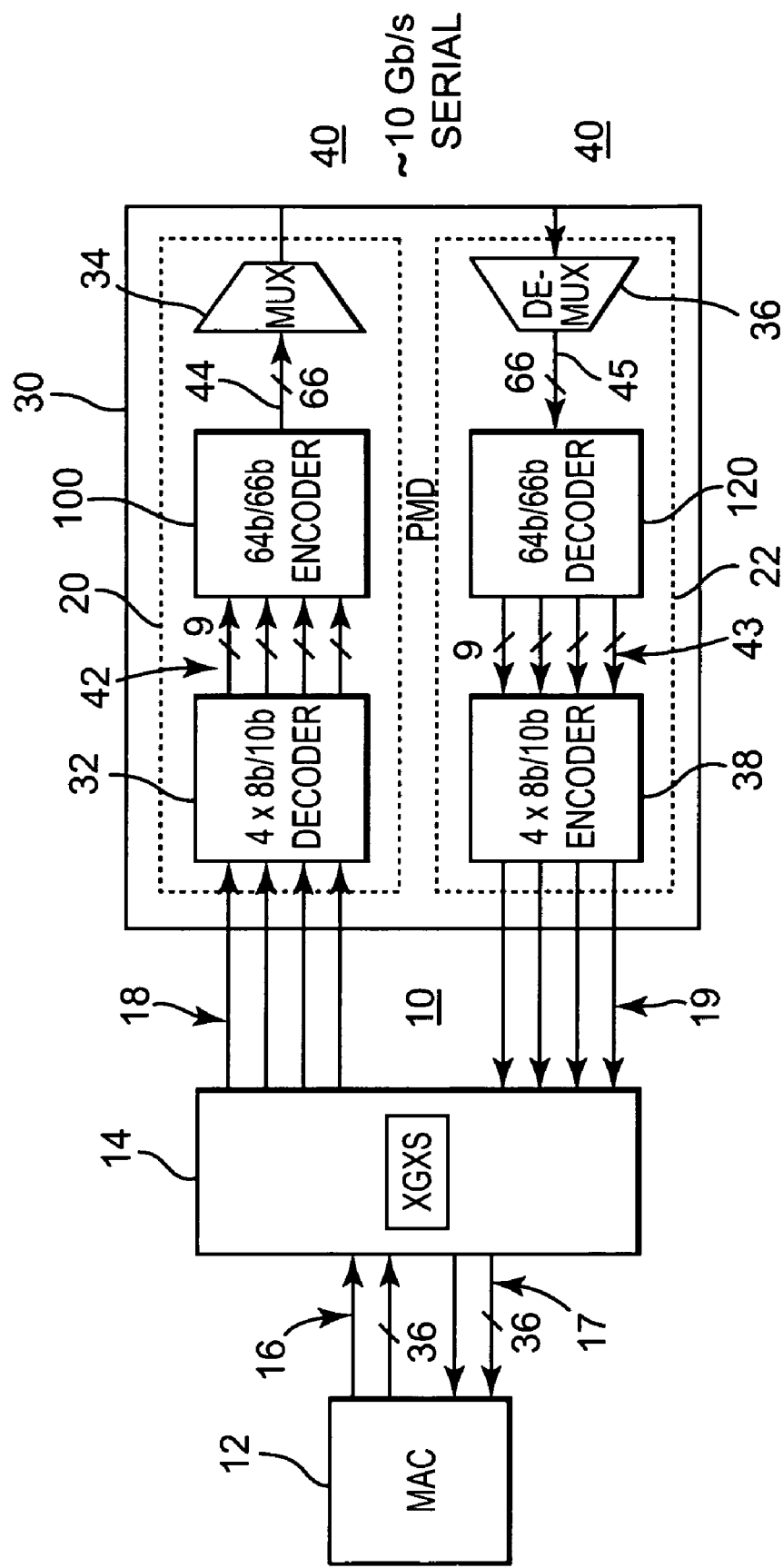
FIG. 1 is a block diagram showing an example of a 10 Gb/s Ethernet interface including a coder according to one embodiment of the invention.

FIG. 1 is a block diagram showing an example of a 10 Gb/s Ethernet interface 10 including the physical coding sublayer module (PCS) 30 that includes an encoder 100 according to one embodiment of the invention. The interface 10 includes medium access controller (MAC) 12, XGMII extender sublayer module (XGXS) 14, and the PCS 30. The MAC 12 sends data including user data received from the host system (not shown) to the XGXS via the 37-conductor XGMII bus 16. The MAC 12 additionally receives data that include user data from the XGXS via the 37-conductor XGMII bus 17 for supply to the host system.

The XGXS 14 sends a coded serial bitstream, to be described below, to the PCS 30 via the 4-lane XAUI bus 18 and receives a coded serial bitstream from the PCS 30 via the 4-lane XAUI bus 19.

The PCS 30 includes the transmission path 20 and the reception path 22. The transmission path 20 is composed of a serial arrangement of a 4x8b/10b decoder 32, the encoder 100, and multiplexer 34. The input of the 4x8b/10b decoder 32 is connected to an output of the XGXS 14 by the XAUI bus 18. The output of the 4x8b/10b decoder 32 is connected to the input of the encoder 100 by the 37-conductor pseudo-XGMII bus 42.

The output of the encoder 100 is connected to the input of the multiplexer 34 by the bus 44. In one embodiment, the bus 44 is 66 conductors wide, but the encoder 100 and the multiplexer 34 may be configured to use a bus that is substantially narrower than this. The output of the multiplexer 34 is a serial bitstream that is fed to the Ethernet medium 40.

The reception path 22 is composed of a serial arrangement of demultiplexer 36, decoder 120, and 4x8b/10b encoder 38. The demultiplexer 36 receives a serial bitstream from the Ethernet medium 40.

The output of the demultiplexer 36 is connected to the input of the decoder 120 by the bus 45. In one embodiment, the bus 45 is 66 conductors wide, but the demultiplexer 36 and the decoder 120 may be configured to use a bus substantially narrower than this. The output of the decoder 120 is connected to the input of the 4x8b/10b encoder 38 by the 37-conductor pseudo-XGMII bus 43.

The output of the 4x8b/10b encoder 38 is connected to an input of the XGXS 14 by the XAUI bus 19.

In the Ethernet interface 10, the MAC 12 receives user data from, and provides user data to, a host system (not shown). The MAC 12 takes any number of words of user data between 46 and 1500, adds 18 or 22 words of address and other data to the front of the user data and four words of a CRC-32 checksum to the end of the user data to form a packet. In this disclosure, the contents of a packet will be called information words.

The MAC 12 additionally generates a Start of Packet (SOP) control word S that it adds to the start of each packet to mark the start of the packet. The MAC 12 additionally generates an End of Packet (EOP) control word T that it adds to the end of each packet to mark the end of the packet. The MAC 12 also generates additional control words and inserts them between consecutive packets to generate a continuous stream of words for transmission to the XGXS 14. The continuous stream is used to maintain receiver phase alignment. The additional control words include Idle and Error E. This disclosure uses the letter Z as a generic term to indicate any one of the control words.

The MAC 12 feeds the continuous stream of words to the XGXS 14 via the XGMII bus 16. Of the 37 conductors in each of the XGMII buses 16 and 17, 32 conductors are allocated to four, parallel, 8-bit words; four conductors are allocated to control word flags, each of which indicates whether a respective one of the four words is an information word or a control word; and one conductor is allocated to a clock signal. A set of four 8-bit words transported in parallel by the XGMII busses 16 and 17 and by the pseudo-XGMII busses 42 and 43 will be referred to as a quad.

In addition, the MAC 12 receives from the XGXS 14 via the XGMII bus 17 a continuous stream of quads. The quads are composed of information words arranged in packets and control words interspersed between consecutive packets, as just described. The start and end of each packet are marked with an SOP and an EOP control word, respectively. The MAC 12 extracts the packet of information words from the stream of quads received from the XGXS 14 using the control word flags received in parallel with the quads to indicate the information words. The MAC 12 also checks the validity of each packet using the CRC-32 checksum that constitutes the last four words of the packet. The MAC 12 then extracts the user data from the packet, and forwards the user data to the host system (not shown).

The XGXS 14 receives the continuous stream of quads from the MAC 12. In one embodiment, the MAC 12 and the XGXS 14 are elements of conventional Ethernet systems. Consequently, the XGXS module 14 applies 8b/10b line code to each word in the quads received from the MAC 12. Each word is coded in response to its respective control word flag so that information words and control words having the same 8-bit code are represented by different 10-bit codes. The XGXS 14 also serializes the 10-bit line code words and feeds them to the input of the PCS 30 via the XAUI bus 18. The XAUI bus 18 is standardized for 10 Gb/s Ethernet and is composed of four parallel conductors, called lanes, each of which carries serial 10-bit line code words at a bit rate of 3.125 Gb/s. Thus, the four conductors constituting the XAUI bus 18 collectively transfer the serial 10-bit line code words to the PCS 30 at an effective bit rate of 12.5 Gb/s.

The XAUI busses 18 and 19 use four parallel conductors to achieve a total bit rate of 12.5 Gb/s because 3.125 Gb/s represents the fastest rate at which data can be reliably transmitted over the conductors of some printed circuit boards using present-day technology. Also, a wide variety of current integrated circuit technologies can support interfaces at this speed some of which would not support a higher speed.

The XGXS 14 also receives four serial bitstreams from the PCS 30 via the XAUI bus 19. The XGXS 14 parallelizes the bitstreams, decodes the 8b/10b coding of the 10-bit line code words constituting the bitstream, and feeds the resulting continuous stream of quads composed of information words and control words to the MAC 12 via the XGMII bus 17. The XGXS 14 additionally feeds a control word flag for each of the words constituting the quads to the MAC 12 via the XGMII bus 17.

In the transmission path 20 of the PCS 30, the 4x8b/10b decoder 32 is connected to the XAUI bus 18 to receive incoming serial 10-bit line code words at a bit rate of 4×3.125 Gb/s. The 4x8b/10b decoder 32 decodes the 8b/10b coding of the 10-bit line code words to recover respective 8-bit words, and generates, for each word, a word type bit that indicates whether the word is an information word or a control word. The 4x8b/10b decoder 32 feeds quads of the 8-bit words and their respective control word flags to the encoder 100 via the pseudo-XGMII bus 42. The pseudo-XGMII bus 42 has the same structure as the XGMII bus 16, but is called pseudo-XGMII in this disclosure to indicate that the logical function of this internal bus is always present but the bus may not be physically instantiated. The pseudo-XGMII bus 42 is composed of 37 conductors. Thirty-two of the conductors are allocated to the quads, four of the conductors are allocated to the control word flags for the quads, and one conductor is allocated to a clock signal.

It might appear that a substantial simplification could be achieved by omitting the XGXS 14, the XAUI busses 18 and 19, the 4x8b/10b decoder 32, the 4x8b/10b encoder 38, and the pseudo-XGMII busses 42 and 43, and simply connecting the encoder 100 and the decoder 120 to the MAC 12 via the XGMII busses 16 and 17. The maximum transmission distance of current embodiments of the XGMII bus is of the order of 100 mm, whereas that of the XAUI bus is of the order of 1 m. Also, the MAC 12 and XGXS 14 are often integrated into a single integrated circuit with the XAUI as the only exposed interface between chips vastly reducing the number of pins required and the number of traces that must be routed on the printed circuit board. Thus, the above-described simplification can be made, but only if the length of the XGMII bus is less than the maximum transmission distance of such bus and the additional pins and traces required for XGMII can be accommodated.

The encoder 100 receives the quads from the pseudo-XGMII bus 42 as input data, encodes consecutive pairs of the quads to generate respective 66-bit frames, as will be described in more detail below, and feeds the packets to the multiplexer 34 via the bus 44.

The multiplexer 34 receives the 66-bit frames, serializes them and transmits them to the Ethernet medium 40 at a bit rate of 10 Gb/s. Typical transmission ranges are 5 m using RG-174 coaxial cable, 10 m using 5 mm coaxial cable and 40 km using optical fibers.

In the reception path 22 of the PCS 30, the demultiplexer 36 separates the serial data received at a bit rate of 10 Gb/s from the Ethernet medium 40 into 66-bit frames, and feeds the frames to the decoder 120 via the bus 45. The decoder 120 decodes the 66-bit frames to generate two consecutive quads of 8-bit words and a control word flag for each word. The decoder 120 transfers the quads and their respective control word flags in parallel to the 4x8b/10b encoder 38 via the pseudo-XGMII bus 43.

The 4x8b/10b encoder 38 applies 8b/10b encoding to the quads received via the pseudo-XGMII bus 43, operating in response to the control word flag for each word constituting the quads. The 4x8b/10b encoder 38 transfers the resulting 10-bit line code words via the XAUI bus 19 to the XGXS module 14 at a bit rate of 12.5 Gb/s. The 10-bit line code words are processed by the XGXS 14 and the MAC 12 to provide the received user data to the host system (not shown), as described above.

The 64b/66b coding applied by the encoder 100 according to one embodiment of the invention will now be described with reference to FIGS. 2, 3A-3D and 4A-4C.

Figures 2, 3A, 3B, 3C, 3D:
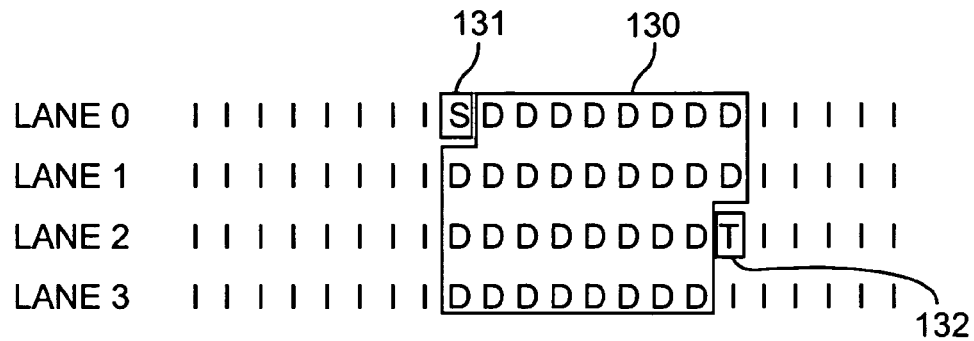
FIG. 2 schematically shows exemplary quads of the input data received by the coder according to one embodiment of the invention.
FIGS. 3A-3D show the twelve possible types of blocks that can be received by the coder according to one embodiment of the invention.

FIG. 2 schematically shows exemplary quads of the input data received by the encoder 100 via the four lanes of the pseudo-XGMII bus 42. The input data include the exemplary packet 130 composed of information words D. To simplify the drawing, the number of information words in the packet 130 is substantially fewer than the minimum number of information words in a standard Ethernet packet.

Prior to the start of the packet 130, the encoder 100 receives control words on all four input lanes of the pseudo-XGMII bus 42. These control words are idles (I) on the XGMII. For transmission over XAUI, the idles are replaced with K, R and A control words. The start of the packet 130 is indicated by the SOP control word S, shown at 131. The SOP control word 131 always appears in lane 0 and never appears in any other lane. If the SOP control word 131 appears in a lane other than lane 0, this indicates an error and the control word is replaced with the error code E.

The information words D constituting the packet 130 are then consecutively received, followed by the EOP control word T, shown at 132. The EOP control word 132 can appear in any of the lanes of the pseudo-XGMII bus 42. The lane in which the EOP control word 132 appears depends on the number of information words in the packet 130. The packet 130 can be composed of any number of information words between 46 and 1500. The minimum number of control words sent by the Ethernet MAC between consecutive packets is 12. Following the EOP control word 132, the encoder 100 receives idle control words via all four lanes of the pseudo-XGMII bus. The control words continue until the SOP control word (not shown) indicating the start of the next packet.

The encoder 100 according to one embodiment of the invention applies 64b/66b encoding to blocks composed of two quads of the input data consecutively received from the pseudo-XGMII bus 42, i.e., the 64b/66b coding is applied to a total of 64 received bits. Thus, the 64b/66b coding uses 66 bits to represent the 64 received bits. The 64b/66b coding adds a master transition composed of 2 bits to the start of the block to form a frame. The master transition serves both as a reference for frame synchronization and as a flag that indicates when the frame is composed exclusively of information words. The 64b/66b coding has a coding efficiency of 64/66, or an overhead of 3.125%. The 64b/66b coding results in a transmitted bit rate that is within 4% of the specified bit rate of existing lasers designed for use in SONET transmitters. It is believed that this transmitted bit rate is within the normal manufacturing performance window for such existing lasers.

Since each word received from the pseudo-XGMII bus 42 can be either a control word or an information word, as indicated by the word's respective control word flag, also received from the pseudo-XGMII bus 42, a fully-general code would need to transmit the control word flag for each word to tell the receiver what type of word is being received. The maximum efficiency of such a code would be 8/9, or a 12.5% overhead. The 64b/66b coding achieves a substantially lower overhead than this by taking advantage of features of the XAUI interface and the Ethernet packet structure that reduce the number of possible ways in which information words and control words can be arranged in the input data.

First, each packet of information words received by the encoder 100 is composed of at least 64 words, always starts with the SOP control word S and always ends with the EOP control word T, and consecutive packets are separated by at least 12 control words. This means that when blocks of eight words (64 bits) of the input data are coded, each block can contain information words exclusively, control words exclusively, a single transition from control words to information words or a single transition from information words to control words. As noted above, the master transition that constitutes the first 2 bits of the frame operates as a flag to indicate when the frame is composed exclusively of information words. This means that, instead of including eight control word flags in each frame to indicate whether the eight words constituting the frame are each an information word or a control word, this number of bits can be used to represent a TYPE word that is included in all frames that are not composed exclusively of information words. Different values of the TYPE word indicate one of the following structural properties of the block: 1) whether the block from which the frame is derived is composed exclusively of control words, 2) the position of the start of a packet in the block from which the frame was derived and 3) the position of the end of a packet in the block from which the frame was derived. Since the number of states represented by the 8-bit TYPE word is relatively small, TYPE words having a large mutual Hamming distance can be chosen. For example, the TYPE words can be chosen so that more than 3-bit errors are required to convert one TYPE word to another.

Second, as noted above, XGMII semantics guarantee that the SOP control word S appears in lane 0 exclusively. This reduces the number of ways in which the packet start can appear in the frame to two, which further reduces the total number of ways in which the start of the packet or the end of the packet can appear in the frame.

Third, the set of control words is sufficiently small to allow the control words to be coded using fewer than 8 bits, and to be coded by a set of codes having a large mutual Hamming distance. The bits saved by coding the control words using fewer than 8 bits can then be used to condense the block to enable the frame to accommodate the above-described TYPE word. The codes are chosen to enable the control word coding to be highly resistant to bit errors.

FIGS. 3A-3D show the twelve possible types of blocks that the encoder 100 can receive from the pseudo-XGMII bus 42 according to one embodiment of the invention. FIG. 3A shows a block generated from two consecutive quads located in the middle of the packet, where both quads consist exclusively of information words. The block composed of two consecutive quads of exclusively information words is called a Type 1 block.

FIG. 3B shows the one block Type that includes two consecutive quads located in the middle of the gap between two consecutive packets, where both quads consist exclusively of control words. The block composed of two consecutive quads of exclusively control words is called a Type 2 block.

FIG. 3C shows the two different block Types in which the start of the packet appears. The start of the packet is indicated by SOP control word S. Because the SOP control word can only appear in lane 0 of the pseudo-XGMII bus, the SOP control word can appear in only two possible locations in the block. The block in which the SOP control word appears in the even-numbered quad is called a Type 3 block, and that in which the SOP control word appears in the odd-numbered quad is called a Type 4 block.

FIG. 3D shows the eight different block Types in which the end of the packet appears. The end of the packet is indicated by the EOP control word T. Because the EOP control word can appear in any one of the four lanes of the pseudo-XGMII bus, the EOP control word can appear in any location in the block. The blocks in which the EOP control word appears as word 1 through 8 of the block (see FIG. 7A) are called Type 5 through Type 12 blocks, respectively.

The 12 different types of blocks are indicated by a code that uses a combination of the master transition and the TYPE word. The 12 types of blocks are divided into two different categories, namely, blocks composed exclusively of information words, i.e., the Type 1 block shown in FIG. 3A, and blocks that include at least one control word, i.e., the Type 2-12 blocks shown in FIGS. 3B-3D.

Figure 4A:
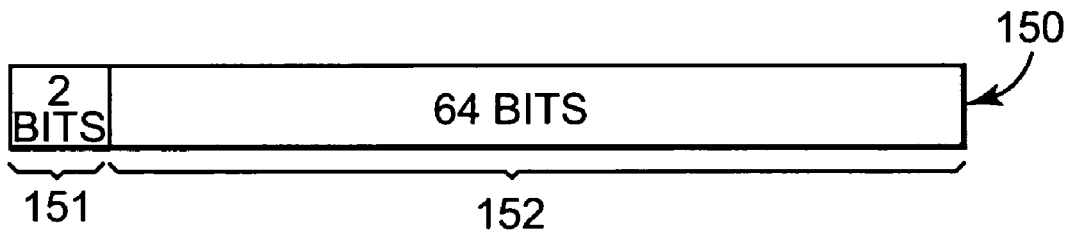
FIGS. 4A-4C show the basic structure of a frame and the two kinds of frames that the coder generates from a block of input data according to one embodiment of the invention.

FIG. 4A shows the basic structure of the frame 150 that the encoder 100 generates from a block of input data according to one embodiment of the invention. The frame 150 is composed of the 2-bit sync field 151 followed by the 64-bit payload field 152. The sync field 151 accommodates the 2-bit master transition. The words accommodated by the payload field 152 are scrambled with a long-period, self-synchronous scrambler to maintain the statistical DC balance of the transmitted bitstream, as will be described in more detail below. In one form of the invention, the 2-bit master transition is also scrambled, as will be described in further detail below.

Figure 4B:
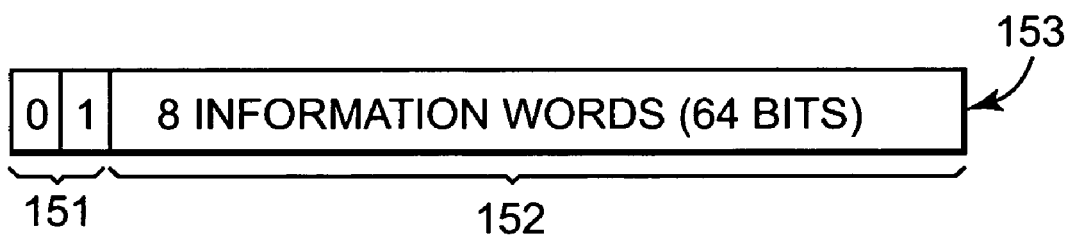

The encoder 100 generates two different kinds of frames having the basic structure shown in FIG. 4A, but differing in the structure of their payload fields 152. The structure of the payload field 152 depends on whether or not the block from which the frame is generated is a Type 1 block composed exclusively of information words. The structure of the payload field 152 is indicated by the master transition stored in the sync field 151. FIG. 4B shows the structure of the frame 153 generated when the block is a Type 1 block. In this case, the master transition in the sync field 151 is 01, and the payload field 152 is composed of the eight information words constituting the block, i.e., 64 bits.

Figure 4C:
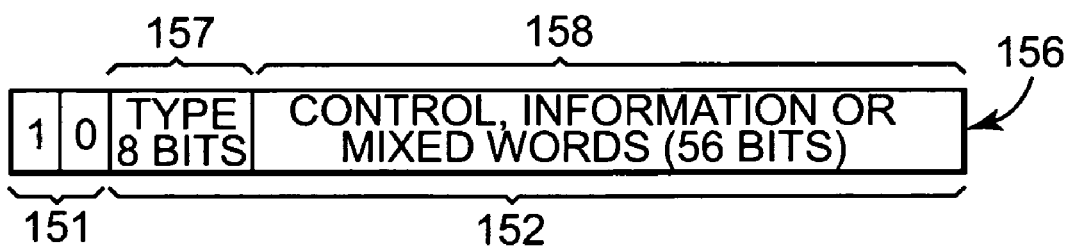

FIG. 4C shows the structure of the frame 156 generated when the block is a Type 2 through Type 12 block that includes at least one control word. In this case, the master transition in the sync field 151 is 10, and the payload field 152 is composed of the 8-bit sub-field 157 and the 56-bit sub-field 158. The 8-bit sub-field 157 is occupied by the TYPE word and the 56-bit sub-field 158 is occupied by a condensed version of the block. In particular, all information words included in the block are included unchanged in the sub-field 158. The 56-bit sub-field 158 can accommodate up to seven information words, the maximum number of information words in a block that includes at least one control word. Moreover, the control words S and T, if they appear in the block, are discarded and are not transferred to the sub-field 158. Finally, all remaining control words in the block are re-coded using fewer than 8 bits and the re-coded control words are included in the sub-field 158. In the preferred embodiment, the remaining control words are re-coded using 7-bit codes chosen to have a mutual Hamming distance of 4 bits.

The control words S and T can be omitted from the sub-field 158 because the position of the start of the packet or the end of the packet in the frame is indicated by the TYPE word included in the sub-field 157. Omitting the control words S and T allows the payload field 152 to accommodate the TYPE word and all seven information words in full when the block is composed of seven information words and either the SOP control word S or the EOP control word T, as in the Type 3 block shown in FIG. 3C and the Type 12 block shown in FIG. 3D. Re-coding the remaining control words as 7-bit words enables the payload field 152 to accommodate the TYPE word and all eight control words when the block is composed exclusively of control words, as in the Type 2 block shown in FIG. 3B. All other combinations of information words and control words are composed of fewer than 56 bits after the S and T control words have been removed and the remaining control words have been re-coded using fewer bits.

Figure 5A:
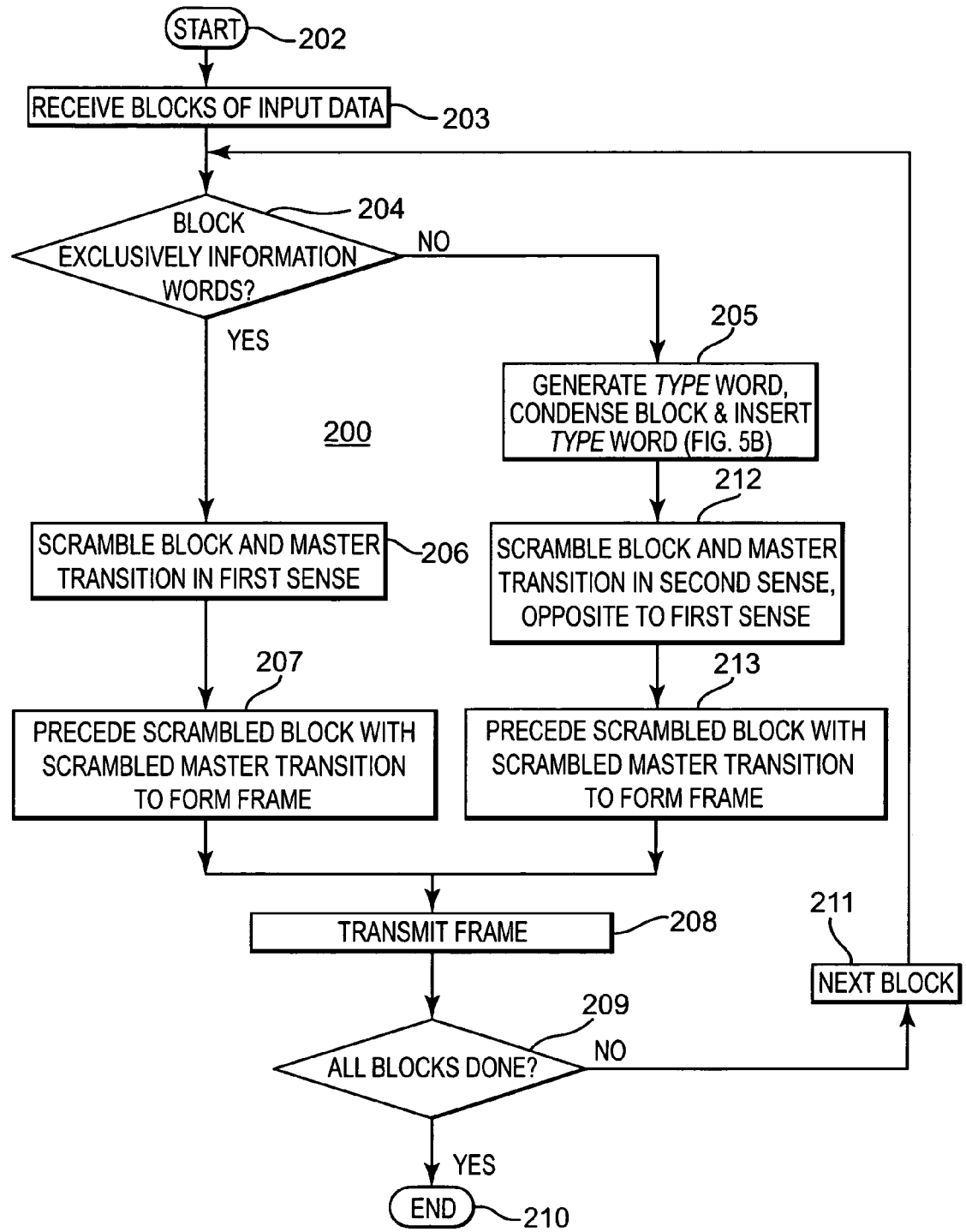
FIG. 5A is a flow chart showing a first embodiment of a coding method according to the invention.

FIG. 5A is a flow chart showing a first embodiment 200 of a method according to the invention for applying 64b/66b coding to input data that include a packet of information data. The processing performed in process 205 of the method will be described in more detail below with reference to FIG. 5B.

The method starts at process 202. In process 203, blocks of the input data are received. The input data include the above-mentioned control words in addition to the packet of information words. The control words precede and follow the packet of information words. The blocks are smaller than the packet. In the preferred embodiment, each block is composed of two successive quads of four parallel words received from the pseudo-XGMII bus 42.

In process 204, a test is performed on a block of the input data to determine whether the block is composed exclusively of information words. In the preferred embodiment, this test can be performed simply by examining the control word flags for the eight words that constitute the block. The control word flags are received together with the words that constitute the block via the pseudo-XGMII bus 42. Alternatively, the test can be performed by testing the quads as they are received, and deriving the test result for the block from the test results for the quads that constitute the block, as will be described in more detail below with reference to FIG. 6.

When the test result is NO, execution advances to process 205, which will be described below. When the test result is YES, execution advances to process 206, where the block and a master transition in the first sense are scrambled.

Execution then advances to process 207, where a frame is formed by preceding the scrambled block with the scrambled master transition. In the preferred embodiment, the master transition in the first sense prior to being scrambled is provided by the two bits 01.

Execution then advances to process 208, where the frame is transmitted, and to process 209, where a test is performed to determine whether all the blocks of the input data have been processed. When the test result is YES, execution advance to process 210, where it ends. When the test result is NO, execution returns to process 204 via process 211 so that the next block can be processed.

When the test result in process 204 is NO, this indicates that the block includes at least one control word. Execution advances to process 205, where a TYPE word that identifies the structural properties of the block is generated, the block is condensed and the TYPE word is inserted into the block. The TYPE word indicates one of the following structural properties of the block: 1) whether the block is composed exclusively of control words, 2) the position in the block of the start of the frame and 3) the position of the end of the frame in the block. Block Types are described in detail above with reference to FIGS. 3A-3D. The processing performed in process 205 will be described in more detail below with reference to FIG. 5B.

Execution then advances to process 212 where the block and a master transition in the second sense, opposite to the first sense, are scrambled.

Execution then advances to process 213, where a frame is formed by preceding the scrambled block with the scrambled master transition. In the preferred embodiment, the master transition in the second sense prior to being scrambled is provided by the two bits 10.

Execution then advances to process 208, where the frame is transmitted, as described above.

The block is described above as being subject to scrambling in processes 206 and 212. In general-purpose data transportation applications, the block is scrambled to help ensure that the receiver can synchronize to the master transitions, and decode the packets. However, in data transportation applications in which random data are transported, the scrambling of the blocks can be omitted. Examples of random data include digital audio signals and compressed data.

Figure 5B:
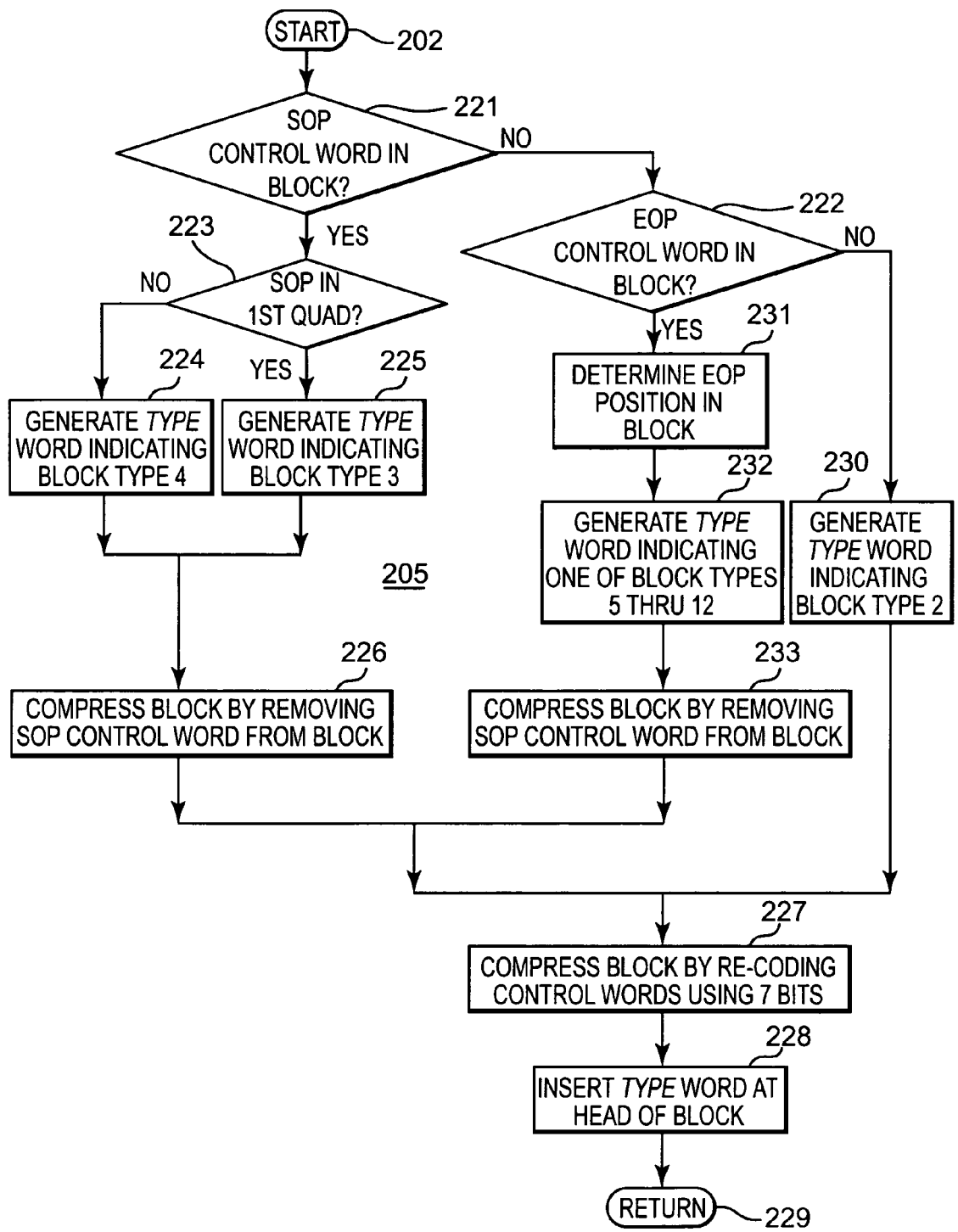
FIG. 5B is a flow chart showing an example of the processing performed in process 205 of the method shown in FIG. 5A according to one embodiment of the invention.

FIG. 5B shows an example of the processing performed in process 205. In this process, the block is condensed and a TYPE word indicating the structural properties of the block is inserted into the block. The structure includes the position of the start or the end of the packet in the block, or whether the block is composed exclusively of control words.

Execution starts in process 220. In process 221, a test is performed to determine whether the block includes the SOP control word S that indicates that the packet starts in the block. When the test result is NO, execution advances to process 222, which will be described below. When the test result is YES, execution advances to process 223, where a test is performed to determine whether the SOP control word appears in the first quad constituting the block. Each block processed by the encoder 100 is composed of two consecutively-received quads.

When the test result generated by process 223 is NO, execution advances to process 224, where a TYPE word indicating that the block is a Type 4 block is generated. A Type 4 block is one in which the SOP control word appears in the second quad. Block types are described in detail above with reference to FIGS. 3A-3D. Execution then advances to process 226, which will be described below. When the test result generated in process 223 is YES, execution advances to process 225, where a TYPE word indicating that the block is a Type 3 block is generated. A Type 3 block is one in which the SOP control word appears in the first quad.

Execution advances from process 224 or process 225 to process 226, where the block is condensed by removing the SOP control word from the block. Condensing the block creates space in the block for the TYPE word generated in process 224 or process 225 to be inserted into the block in process 228, to be described below.

Execution then advances to process 227, where the block is condensed by re-coding any control words in the block using fewer bits. If either process 226 or process 233 has previously been executed, the effect of executing process 227 is to compress the block further. Process 233 will be described below. The purpose of condensing the block is described above. In the preferred embodiment, the 8-bit control words are re-coded using fewer bits. The set of control words is sufficiently small to allow the control words to be coded using 7-bit codes chosen to have a mutual Hamming distance of 4 bits. The re-coding process can refer to the TYPE word for the block to find the locations of the control words in the block.

Execution then advances to process 228, where the TYPE word is inserted at the head of the block. Space to accommodate the TYPE word has been created in the block by executing one or more of processes 226, 227 and 233. Process 233 is described below.

Execution then advances to process 229, whence it returns to the main routine.

When the test result in process 221 is NO, execution advances to process 222, where a test is performed to determine whether the block includes the EOP control word T that indicates that the end of the packet appears in the block. When the test result is NO, execution advances to process 230, which will be described below. When the test result is YES, execution advances to process 231, where the position of the EOP control word in the block is determined. As shown in FIG. 3D, any of the eight words in the block can be the EOP control word.

Execution then advances to process 232, where a TYPE word is generated in accordance with the position of the EOP control word in the block. The TYPE word indicates that the block is one of a Type 5 through Type 12 block. Type 5 through Type 12 blocks are blocks in which the EOP control word appears in one of the eight word positions in the block, as described above with reference to FIG. 3D.

Execution then advances to process 233, where the block is condensed by removing the EOP control word from the block. The purpose of condensing the block is described above.

Execution then advances to process 227, where the block is further condensed by re-coding any control words remaining in the block using fewer bits, as described above.

A test result of NO in process 222 indicates that the block is composed exclusively of control words. In this case, execution advances to process 230 where a TYPE word indicating that the block is a Type 2 block is generated. A Type 2 block is a block composed exclusively of control words.

Execution then advances to process 227, where the block is condensed by re-coding the control words included in the block using fewer bits, as described above. In this case, all eight words in the block are control words and are re-coded.

Note that in the above processing, such information words as are included in the block remain unchanged.

Figure 6:
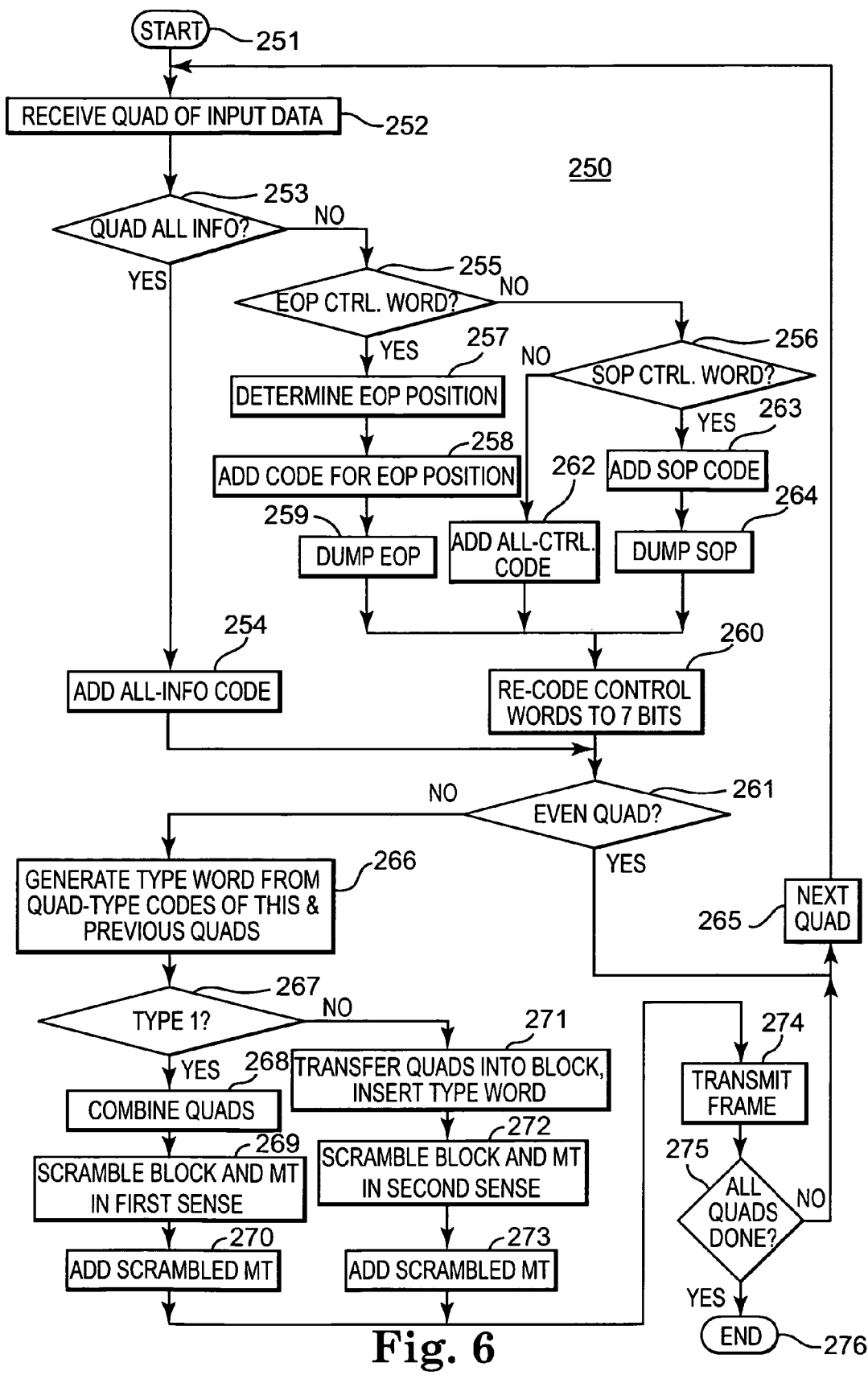
FIG. 6 is a flow chart showing a second, quad-based embodiment of a coding method according to the invention.

FIG. 6 is a flow chart showing a second embodiment 250 of a coding method according to the invention for applying 64b/66b coding to input data that include a packet of information data. This embodiment is quad-based rather than block-based. The method starts at process 251. In process 252, a quad of input data is received from the pseudo-XGMII bus 42 shown in FIG. 1. A control word flag for each word in the quad is also preferably additionally received.

In process 253, a test is performed to determine whether the quad is composed exclusively of information words. This test can be performed simply by examining the control word flags of the quad. When the test result is YES, execution advances to process 254, where a quad-type code indicating that the quad is composed exclusively of information words is appended to the quad. Execution then advances to process 261, which will be described below. When the test result is NO in process 253, execution advances to process 255.

In process 255, a test is performed to determine whether any of the control words in the quad is the end-of-packet (EOP) control word. When the test result is NO, execution advances to process 256, which will be described below. When the test result is YES, execution advances to process 257, where the position of the EOP control word in the quad is determined, and to process 258, where a quad-type code is appended to the quad. The quad-type code indicates the position of the EOP control word in the quad.

In process 259, the EOP control word is removed from the quad. This has the effect of condensing the block of which the quad is a constituent.

In process 260, any other control words in the quad are re-coded using fewer bits, as described above. This has the effect of further condensing the block of which the quad is a constituent. Execution then advances to process 261, which will be described below.

When the test result in process 255 is NO, execution advances to process 256 where a test is performed to determine whether any of the control words in the quad is the start of packet (SOP) control word. When the test result is NO, execution advances to process 262, where a quad-type code indicating that the quad is composed exclusively of control words is appended to the quad. Execution then advances to process 260, described above, where the control words are re-coded, and then to process 261, to be described below.

When the test result in process 256 is YES, execution advances to process 263, where a quad-type code indicating that the SOP control word appears in lane 0 of the quad is appended to the quad.

In process 264, the SOP control word is removed from the quad. This has the effect of condensing the block of which the quad is a constituent.

Execution then advances to process 260, described above, where the control words are re-coded, and then to process 261, to be described next.

In process 261, a test is performed to determine whether the quad just processed is an even-numbered quad. When the test result is YES, execution returns to process 252 via process 265 so that the next quad can be received and processed. In this case, the next quad is the second quad that constitutes the block from which the frame will be generated. A test result of NO indicates that both quads that constitute the block have been received and processed, and execution advances to process 266.

In process 266, the quad-type codes appended to the two quads are examined to determine the block Type of the block that will be generated from the quads, and to generate the TYPE word for the block. For example, when the quad-type code of the even-numbered quad indicates that the SOP control word appears in the quad, and the quad-type code for the odd-numbered quad indicates that the quad is composed exclusively of information words, the process 266 determines that the block is a Type 3 block (see FIG. 3C).

Although TYPE words are allocated only to blocks that include a control word, the processing 250 can be simplified by allocating an additional TYPE word to Type 1 blocks, i.e., blocks composed exclusively of information words. The additional TYPE word is used internally by the processing 250, and is never inserted into the block. For example, the word $00_H$ can be used as the TYPE word for Type 1 block. In process 267, a test is performed to determine whether the block is composed exclusively of information words by testing whether the block is a Type 1 block. When the test result is YES, execution advances to process 268, where the quads are combined to form the block.

In process 269, the block and a master transition in the first sense are scrambled, as described above. In the preferred embodiment, the master transition in the first sense prior to being scrambled is provided by the two bits 01. The scrambling of the block may be omitted when the information words are random, as described above.

In process 270, the frame is formed by preceding the scrambled block with the scrambled master transition.

Execution then advances to process 274, which will be described below.

When the test result generated in process 267 is NO, execution advances to process 271, where the quads are combined to form the block and the TYPE word is inserted. The TYPE word is inserted at the head of the block. In combining the quads, the information words are shifted to abut one another and also to abut either the TYPE word or the end of the block. The coded control words are shifted to abut one another and also to abut either the end of the block or the TYPE word (see FIGS. 7A-7L for examples). Any gap between the information words and the control words is filled with fill bits.

In process 272, the block and a master transition in the second sense are scrambled, as described above. In the preferred embodiment, the master transition in the second sense prior to being scrambled is provided by the two bits 10. Again, the scrambling of the block is optional if the information words are random.

In process 273, the frame is formed by preceding the scrambled block with the scrambled master transition.

Execution then advances to process 274, which will be described next.

In process 274, the frame is transmitted.

In process 275, a test is performed to determine whether all the quads of the input data have been processed. When the test result is YES, execution advances to process 276, where it ends. When the test result is NO, execution returns to process 252 via process 265, described above, so that the next quad, an even-numbered quad, can be processed.

Figure 7A:
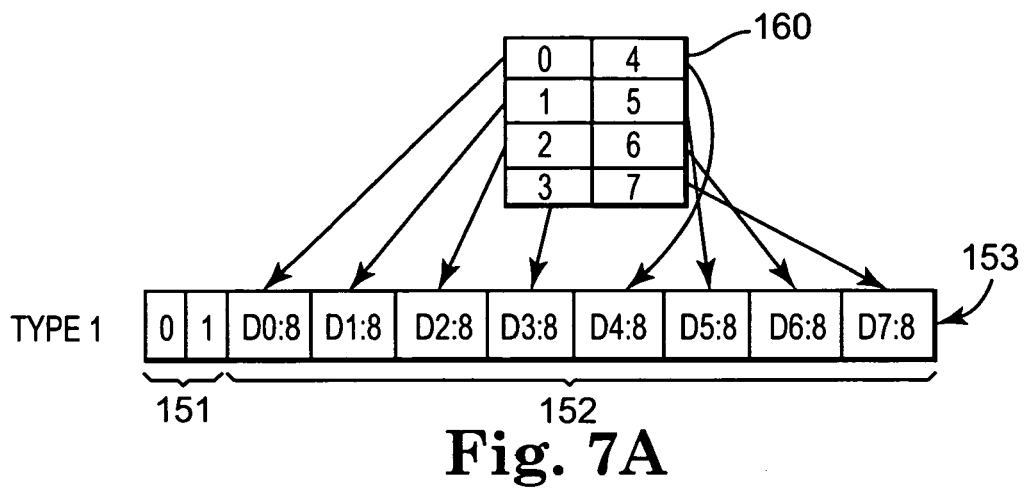

FIGS. 7A-7L show specific examples of the frames generated from each of the twelve block types shown in FIGS. 3A-3D, including the master transition and the TYPE word, where used. In FIGS. 7A-7L, the bits of the master transition and the block are shown unscrambled. In one form of the invention, the bits of the master transition and the block are scrambled before the frame is transmitted. FIG. 7A shows the frame 153 generated from the Type 1 block shown in FIG. 3A. This block is composed exclusively of information words. In the frame 153, the sync field 151 is filled with the 2-bit master transition 01 and the payload field 152 is filled with the eight information words located in the eight positions 0 through 7 in the block 160, as shown. Each of the information words in the payload field 152 is labeled with the letter D, a number and the numeral 8. The letter D indicates an information word, the number indicates the location of the information word in the block 160 and the numeral 8 indicates that the information word is composed of 8 bits.

Figure 7B:
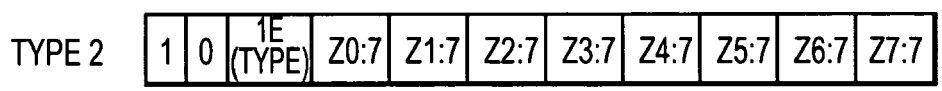
Figure 7C:
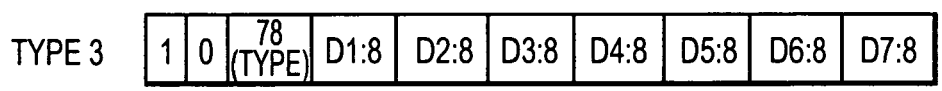
Figure 7D:
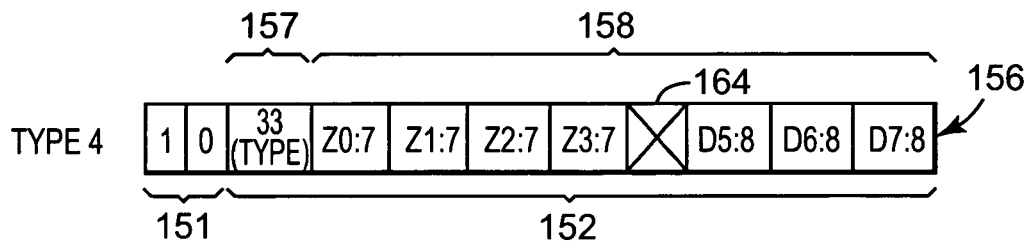
Figure 7E:
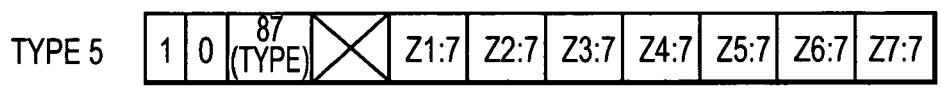
Figure 7F:

FIG. 7B shows a frame generated from the Type 2 block shown in FIG. 3B. FIGS. 7C and 7D respectively show frames generated from the Type 3 and Type 4 blocks shown in FIG. 3C. FIGS. 7E-7L respectively show frames generated from the Type 5 through 12 blocks shown in FIG. 3D. As an example, FIG. 7D shows the frame 156 generated from the Type 4 block shown in FIG. 3C. The Type 4 block is composed partly of control words, i.e., the SOP control word S and the unspecified control words Z, and partly of information words D. In the frame 156, the sync field 151 is occupied by the 2-bit master transition 10 and, in the payload field 152, the sub-field 157 is occupied by the 8-bit TYPE word, in this example, the hexadecimal number $33_H$. The TYPE word indicates that the frame is generated from a Type 4 block in which the start of a packet appears in the odd-numbered quad constituting the block. The sub-field 158 of the payload field is occupied by four coded control words Z and three 8-bit information words D.

Each of the data elements in the sub-field 158 is labeled with the letter D or Z, a number and the numeral 7 or 8. The letter D indicates an information word, the letter Z indicates a control word, the number indicates the location of the information word or control word in the block using the convention described above with reference to FIG. 7A, the numeral 7 or 8 indicates the number of bits in the data element, i.e., 7 bits for each coded control word and 8 bits for each information word. As noted above, the SOP control word S is discarded and is not transferred to the sub-field 158. The function of the SOP control word indicating that the packet starts at position 4 of the block is provided by the TYPE code $33_H$ instead.

The four coded control words Z coded as 7-bit words and three 8-bit information words D do not fully occupy the sub-field 158 of the frame 156. The unoccupied region 164 of the sub-field is filled with suitable idle bits. Alternatively, functions can be assigned to the bits used to fill the unoccupied portions of the sub-field 158.

The TYPE words illustrated in FIGS. 7B-7L are chosen to have a mutual Hamming distance of 4 bits to ensure that the start and the end of the packet are reliably identified. The TYPE words are additionally chosen to be easy to generate and to test. The set of chosen TYPE words is an eleven-element sub-set of a 16-element set generated as follows: the first 4 bits of each successive element in the set increments from 0 to 15 in binary. The second 4 bits of each element provide the minimum Hamming distance protection and are either 1) a duplication of the first 4 bits when the parity of the first 4 bits is even, or 2) the complement of the first 4 bits when the parity of the first 4 bits is odd. The 16-element set is optimum in that it provides for a very simple implementation with low gate delay and latency.

At first sight, the 2 bits constituting the master transition would appear to suffer from the disadvantage that a 2-bit error can convert the kind of frame defined by the master transition from a frame that lacks the TYPE word (FIG. 4B) to a frame that includes the TYPE word (FIG. 4C). This is not robust enough to meet Ethernet requirements. However, master transition errors as large as 4 bits can be detected in the decoder 120 by monitoring the sequencing of the kinds of frames. As noted above, each frame can be one of four different kinds, namely, one composed exclusively of information words D (Type 1), one that includes the start of packet S (Types 3 and 4), one that includes the end of packet T (Types 5-12) and one composed exclusively of control words Z (Type 2). In normal operation, the four different frame types are generated in a predetermined order, namely: S, D, . . . , D, T, Z, . . . Z, S, D, . . . , D, T, Z, . . . , Z, etc., and must be received in the same predetermined order. By monitoring the order of the kinds of frames received and flagging violations of the predetermined order by adding the error control word E to the decoded data, the MAC 12 can void damaged packets.

Figure 8A:
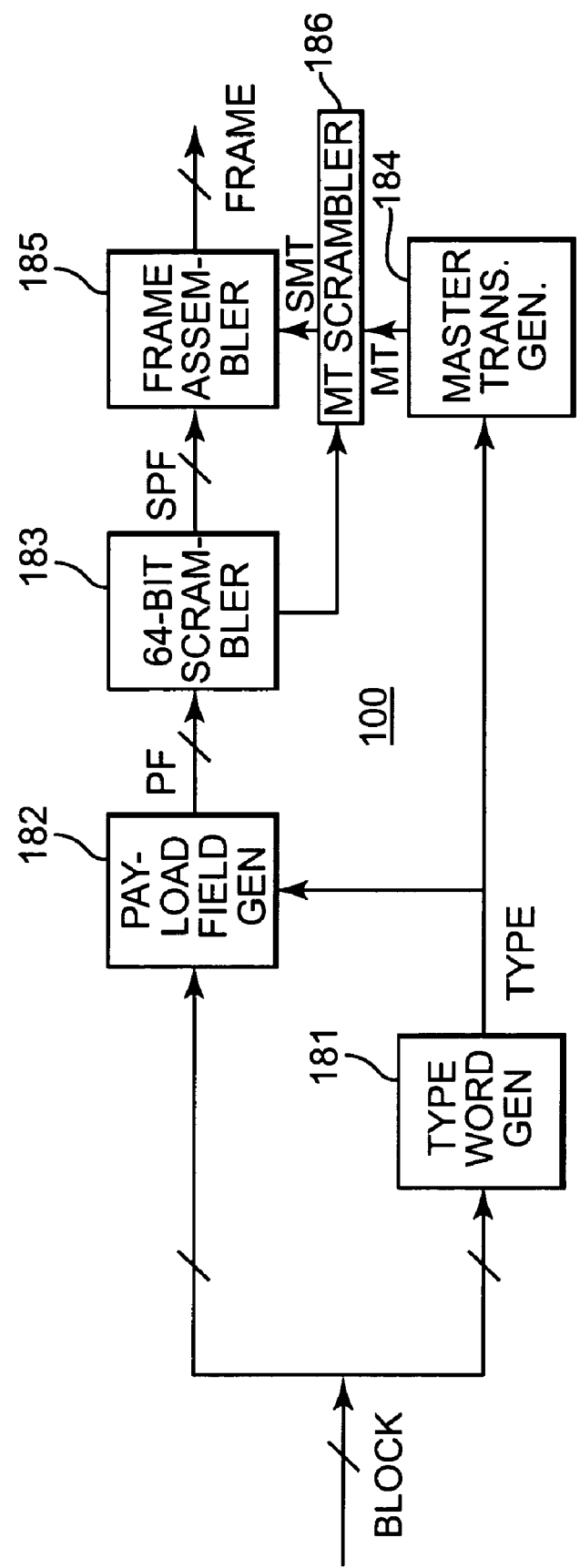
FIG. 8A is a block diagram showing a first embodiment of a coder according to the invention.

FIG. 8A is a block diagram showing a first embodiment of the encoder 100 according to the invention. The encoder 100 includes type word generator 181, payload field generator 182, 64-bit scrambler 183, master transition generator 184, frame assembler 185, and master transition scrambler 186.

In the encoder 100, the type word generator 181 and the payload field generator 182 are connected to receive blocks of input data from the 4x8b/10b decoder 32 via the pseudo-XGMII bus 42 (FIG. 1). The input data are composed of control words and a packet of information words. The packet is preceded and followed by the control words. In the preferred embodiment, the blocks are eight words, i.e., 64 bits, long and are smaller than the smallest size of the packet. The blocks are also smaller than the number of control words between consecutive packets. The encoder 100 processes the input data block-by-block to generate respective frames for transmission.

The type word generator 181 generates a TYPE word whose value indicates one of the following mutually-exclusive structural properties of the block: 1) whether the block is composed exclusively of control words other than end of packet, 2) a position of the start of the packet in the block and 3) a position of the end of the packet in the block and 4) whether the block is composed exclusively of information words. The type word generator feeds the TYPE word to the payload field generator 182 and the master transition generator 184. The value of the TYPE word that indicates whether the block is composed exclusively of information words may take the form of a flag bit fed to the master transition generator 184 and, optionally, to the payload field generator 182.

The payload field generator 182 operates in response to the TYPE word. When the TYPE word indicates that the block is composed exclusively of information words, the payload field generator 182 adopts the block to form a payload field. Otherwise, when the TYPE word indicates that the block is not composed exclusively of information words, the payload field generator condenses the block and inserts the TYPE word into the block to form the payload field.

The payload field generator 182 condenses the block by performing one or both of the following operations: 1) removing any start-of-packet control word or an end-of-packet control word from the block, and 2) re-coding any other control words in the block using fewer bits. In the preferred embodiment, the control words are re-coded using 7-bit codes having a mutual Hamming distance of 4 bits. Whether the payload field generator 182 simply adopts the block as the payload field, or processes the block further before forming the payload field, may be determined by the above-mentioned flag bit in lieu of the full TYPE word. The TYPE word indicates the location in the block of the start-of-packet control word or the end-of-packet control word (if any) and the locations in the block of the other control words (if any).

The payload field generator 182 feeds the payload field PF generated from the block to the 64-bit scrambler 183.

The 64-bit scrambler 183 is a self-synchronous scrambler based on a high-order polynomial and will be described in more detail below. The scrambler 183 may be omitted in embodiments of the encoder 100 designed exclusively for transmitting input data that is already random, as described above. The scrambler 183 feeds the scrambled payload field SPF it generates from the payload field PF to the frame assembler 185.

The master transition generator 184 operates in response to the TYPE word, or, alternatively, to the flag bit described above, and generates a master transition. The master transition generator 184 generates the master transition in a first sense when the TYPE word, or flag bit, indicates that the block is composed exclusively of information words. Otherwise, when the TYPE word, or flag bit, indicates that the block is not composed exclusively of information words, the master transition generator 184 generates the master transition in a second sense, opposite to the first sense. In the preferred embodiment, the master transition in the first sense is 01, and the master transition in the second sense is 10. Transitions opposite to those shown could alternatively be used. The master transition generator 184 feeds the master transition MT to the master transition scrambler 186.

In one embodiment, the master transition scrambler 186 scrambles the 2-bit master transition received from master transition generator 184, using a scrambler bit provided by 64-bit scrambler 183, and thereby generates a scrambled master transition SMT which is provided to frame assembler 185. In one embodiment, the single scrambler bit provided by 64-bit scrambler 183 is used by master transition scrambler 186 to scramble both bits of the 2-bit master transition generated by master transition generator 184. In one form of the invention, master transition scrambler 186 performs an XOR operation on the scrambler bit and the first bit of the master transition, with the result of the XOR operation being the first bit of the scrambled master transition, and performs an XOR operation on the same scrambler bit and the second bit of the master transition, with the result of the second XOR operation being the second bit of the scrambled master transition. The master transition scrambler 186 feeds the scrambled master transition SMT to the frame assembler 185. In one form of the invention, the single scrambler bit provided by the 64-bit scrambler 183 is not a bit used to scramble the first or last bit of the payload field. Using the first or last bit of the payload field as the scrambler could create a false master transition for some values of payload fields. It would be possible to check for and ignore the false master transition, but it is simpler to avoid creating the situation.

The frame assembler 185 receives the scrambled payload field SPF from the 64-bit scrambler 183 and the scrambled master transition SMT from the master transition scrambler 186, and appends the scrambled master transition to the scrambled payload field to form the frame for transmission. The frame assembler 185 preferably locates the scrambled master transition before the scrambled payload field, but could alternatively locate the scrambled master transition after the scrambled payload field.

The frame assembler feeds the 66-bit frame to the multiplexer 34 via the bus 44 (FIG. 1).

Figure 8B:
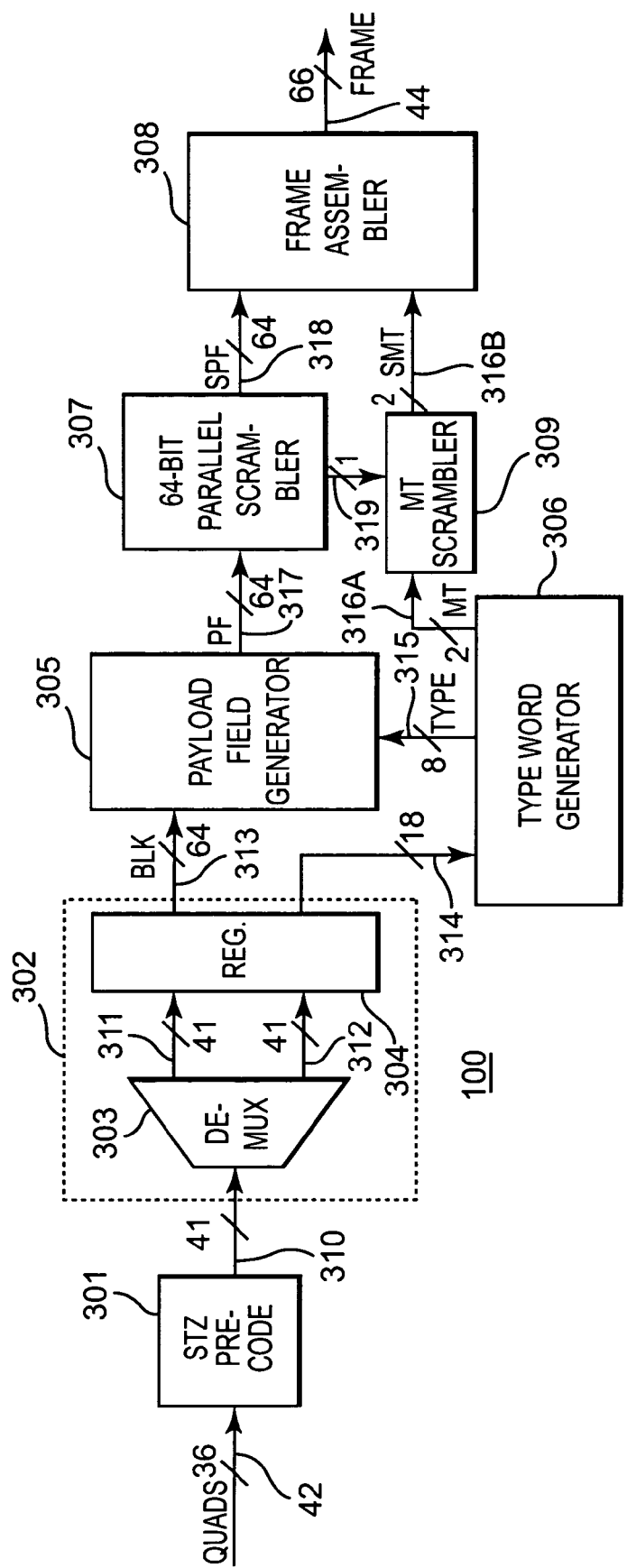
FIG. 8B is a block diagram showing a second, quad-based embodiment of a coder according to the invention.

FIG. 8B is a block diagram showing a second embodiment of the encoder 100 according to the invention. In this embodiment, the processing is quad based. The encoder 100 includes STZ pre-coder 301, block generator 302 composed of demultiplexer 303 and register 304, payload field generator 305, type word generator 306, 64-bit scrambler 307, frame assembler 308, and master transition scrambler 309.

The STZ pre-coder 301 receives quads of words and their respective control word flags via the pseudo-XGMII bus 42. The STZ pre-coder 301 generates a quad-type code for each quad. The quad-type code is analogous to the above-described TYPE word that indicates the block Type of a block, but pertains to a quad. The quad-type code is a code whose value indicates one of the following mutually-exclusive structural properties of the quad: 1) whether the quad is composed exclusively of information words, 2) whether the quad is composed exclusively of control words other than EOP, 3) whether the SOP control word appears in the quad, and 4) the position in the quad of the EOP control word (if any). Characteristic 1) can be detected simply by examining the control word flags.

For each quad that is not composed exclusively of information words, the STZ pre-coder 301 condenses the quad by re-coding each word, if any, in the quad that is indicated by its control word flag to be a control word. The codes for coding the control words are chosen to have a mutual Hamming distance of 4 bits. Re-coding the SOP and EOP control words is optional since these control words are later discarded by the payload field generator 305. The STZ pre-coder 301 additionally appends the four control word flags and the quad-type code to the quad, which may have been condensed, to form a pre-coded quad, and feeds the pre-coded quad to the block generator 302 via the 41-bit wide bus 310.

The block generator 302 receives consecutive pairs of pre-coded quads from the STZ pre-coder 301 and forms the blocks of eight words from them. In the block generator 302, the de-multiplexer 303 receives the consecutive pairs of pre-coded quads and switches them alternately to outputs connected via 41-bit wide busses 311 and 312 to corresponding inputs of the register 304.

The register 304 outputs the pairs of pre-coded quads in parallel. The pre-coded quads are output in two parts that effectively split the quads from their respective quad-type codes and the control word flags. The pair of quads received by the register 304 form the block BLK that is fed by the 64 bit-wide bus 313 to the payload field generator 305. The pair of quad-type codes and the control words flags corresponding to the block are fed by the 18-bit wide bus 314 to the type word generator 306.

The type word generator 306 determines the block Type of the block BLK from the pair of quad-type codes for the block received via the bus 314, generates the corresponding TYPE word and feeds the TYPE word to the payload field generator 305 via the 8-bit bus 315. For example, when the quad code for the even-numbered quad indicates that the quad is composed exclusively of information words, and the quad code for the odd-numbered quad indicates that the EOP control word T is the third word of the quad, the type word generator generates the TYPE word for a Type 11 block. As another example, when both quad codes indicate that the corresponding quads are composed exclusively of information words, the type word generator generates a special additional value of the TYPE word, such as 00. This special value of the TYPE word is used only internally within the encoder 100 to indicate that the block is a Type 1 block. This value of the TYPE word is not inserted into the payload field 152 of the frame generated for transmission (see FIG. 4B).

When the type word generator 306 determines that the block is a Type 1 block, it generates the master transition MT in the first state, i.e., 01 in the preferred embodiment, and feeds the master transition to the master transition scrambler 309 via the 2-bit bus 316A. When the type word generator 306 determines that the block is other than a Type 1 block, it generates the master transition MT in the second state, i.e., 10 in the preferred embodiment, and feeds the master transition to the master transition scrambler 309 via the 2-bit bus 316A.

In one embodiment, the master transition scrambler 309 scrambles the 2-bit master transition received from type word generator 306, using a scrambler bit provided by 64-bit scrambler 307 via the 1-bit bus 319, and thereby generates a scrambled master transition SMT, which is provided to frame assembler 308 via 2-bit bus 316B. In one embodiment, the single scrambler bit provided by 64-bit scrambler 307 is used by master transition scrambler 309 to scramble both bits of the 2-bit master transition generated by type word generator 306. In one form of the invention, master transition scrambler 309 performs an XOR operation on the scrambler bit and the first bit of the master transition, with the result of the XOR operation being the first bit of the scrambled master transition, and performs an XOR operation on the same scrambler bit and the second bit of the master transition, with the result of the second XOR operation being the second bit of the scrambled master transition. The master transition scrambler 309 feeds the scrambled master transition SMT to the frame assembler 308.

When the payload field generator 305 receives from the type word generator 306 the special value of the TYPE word that indicates the block is a Type 1 block, the payload field generator 305 adopts the block received from the block generator 302 via the bus 313 as the payload field 152 of the frame 153 that will be generated from the block (see FIG. 4B). The payload field 152 has a size of 64 bits and is composed exclusively of information words.

When the payload field generator 305 receives from the type word generator 306 a value of the TYPE word that indicates the block is not a Type 1 block, the payload field generator 305 transfers the contents of the block received from the block generator 302 via the bus 313 into the sub-field 158 of the payload field 152 of the frame 156 that will be generated from the block (see FIG. 4C), and inserts the TYPE word into the sub-field 157 of the payload field. In performing this transfer, any start-of-packet control word or end-of-packet control word that appears in the block is not transferred to the payload field to condense the block. When the size of the contents of the block without the SOP or EOP control word, is less than 56 bits, the payload field generator 305 pads the sub-field 158 to 56 bits, as shown in FIG. 7G, for example. This makes the total size of the payload field 152 64 bits. The payload field generator 305 employs a bank of 64 three-input data selectors that operate in response to the TYPE word to transfer the contents of the block to the payload field.

The payload field generator 305 feeds each payload field PF that it generates to the 64-bit scrambler 307 via the 64-bit bus 317.

The 64-bit scrambler 307 scrambles the payload field PF received from the payload field generator 305 using a high-order polynomial scrambler, the characteristics of which will be described below. The scrambling of the payload field may be omitted in embodiments of the encoder 100 designed exclusively for transmitting input data that is already random, as described above. The 64-bit scrambler 307 feeds the scrambled payload field SPF to the frame assembler 308 via the 64-bit wide bus 318.

The frame assembler 308 appends the scrambled master transition SMT to the scrambled payload field SPF and feeds the resulting 66-bit frame to the multiplexer 34 (FIG. 1) via the 66-bit wide bus 44. The scrambled master transition is preferably appended to the front of the scrambled payload field, but may optionally be appended to the end of the scrambled payload field.

The use of self-synchronizing scramblers based on polynomials to scramble bitstreams is known in the art. In the coder and coding method according to one embodiment of the invention, the payload field 152 of each frame 150 (see FIG. 4A) is scrambled so that when the frames are transmitted, the resulting bitstream is statistically DC balanced and additionally appears to be random. Scrambling the payload fields enables the decoder to synchronize easily on the 2-bit master transitions, which are also scrambled, but are each scrambled with a single scrambler bit in one embodiment. Thus, in one embodiment, the scrambled master transition is always 10 or 01, and never 11 or 00, so there will always be a transition at the start of each frame. No other part of the frame will have this characteristic since all of the other bits in the frame are independently scrambled in one form of the invention. By scrambling the master transitions in this manner, the signal transition at the beginning of each frame is retained, and the spectral peaks caused by transmitting a repeating master transition pattern are eliminated.

Choosing the tap spacings of the polynomial to optimize the scrambler for a given application is challenging. In the case of the scrambler for the 10 Gb/s Ethernet coder according to one embodiment of the invention, the scrambling polynomials are chosen to meet the following requirements: the chosen polynomial must cause no violations of the Ethernet-standard CRC 32 coding under exhaustive three-error tests with spill-in and spill-out for all packet sizes; the polynomial tap spacings must be greater than eight to prevent error multiplication from degrading the Hamming distance among the TYPE words; and the polynomial order should be >57 to prevent malicious jamming and <64 to minimize implementation complexity.

A polynomial that meets the above criteria, and an additional polynomial that meets most of the criteria are: the preferred choice is $x^{58}+x^{19}+x^0$ and the alternative choice is $x^{65}+x^{18}+x^0$.

In the preferred embodiment, the blocks are scrambled using a 64-bit, self-synchronizing, parallel scrambler 183 or 307 using the preferred polynomial. In one embodiment, the scrambler 183 or 307 is also used to scramble the master transitions, and a separate master transition scrambler 186 or 309 is not used. In another form of the invention, the master transitions are scrambled with the master transition scrambler 186 or 309 by reusing one scrambler bit from the 64-bit payload scrambler 183 or 307 to perform pair-wise scrambling, wherein the one scrambler bit (e.g., the scrambler bit that is used to scramble the first bit of the payload field) is used to scramble both bits of the master transition. In one form of this embodiment, where the two bits of the master transition are scrambled as a pair, rather than being individually scrambled, the master transition scrambler 186 or 309 performs XOR operations with the scrambler bit and both bits of the master transition, or performs an XOR operation with the scrambler bit and one bit of the master transition to generate a first bit of the scrambled master transition, and inverts this first bit to obtain the second bit of the scrambled master transition. In this embodiment, scrambler 186 or 309 differs from a conventional scrambler in that scrambler 186 or 309 does not generate its own scrambler bits, and each bit to be scrambled is not XOR'ed with a different scrambler bit. In another embodiment of the invention, the master transition scrambler 186 or 309 is a separate self-synchronous scrambler that generates its own scrambler bits, and performs pair-wise scrambling of the master transitions. In one form of this embodiment, the separate self-synchronous scrambler 186 or 309 is a relatively short (e.g., 8-bit or 16-bit) scrambler.

Figure 9A:
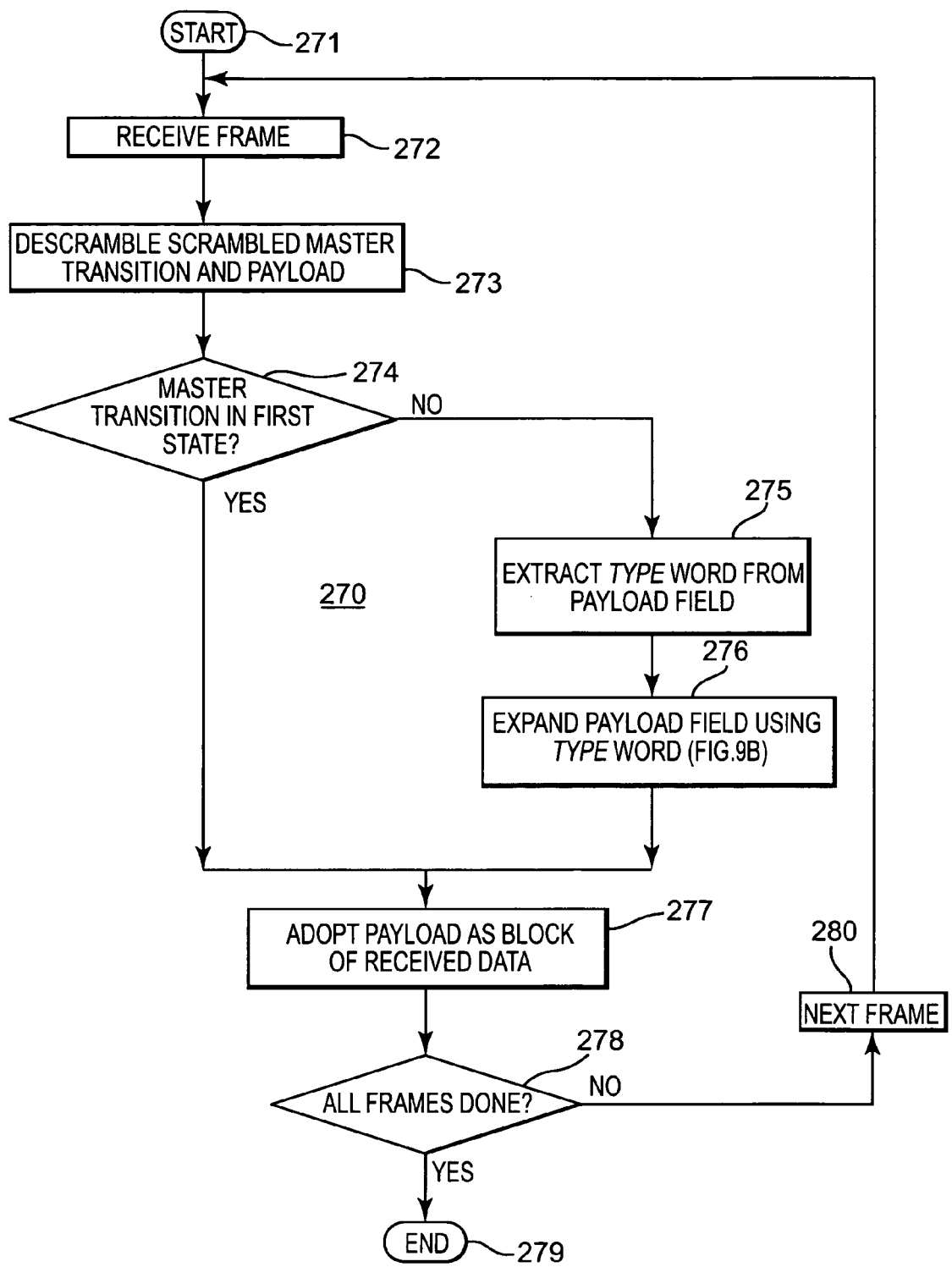
FIG. 9A is a flow chart showing an example of a decoding method for decoding the frames generated by the coding method and coder according to one embodiment of the invention.

FIG. 9A is a flow chart showing an example 270 of a decoding method for decoding the frames generated by the coding method and coder according to one embodiment of the invention.

The method starts in process 271. In process 272, a frame is received from the demultiplexer 36 via the bus 45 (FIG. 1). In process 273, the scrambled payload field of the frame and the scrambled master transition are descrambled. The process of descrambling the payload may be omitted if the encoder 100 did not scramble the payload (see above). In process 274, a test is performed on the master transition of the frame to determine whether the master transition is in the first state. The first state is 01 in the preferred embodiment. When the test result is YES, which indicates that the payload field of the frame is composed exclusively of information words, execution advances to process 277, which will be described below. When the test result is NO, execution advances to process 275.

A NO result in process 274 indicates that the payload field of the frame is not composed exclusively of information words, and therefore includes a TYPE word. In process 275, the TYPE word is extracted from the payload field.

In process 276, the payload field of the frame is expanded using the information provided by the TYPE word regarding the structure of the payload field. Expanding the payload field reverses the condensing that was applied by the encoder 100 to the block from which the frame was generated. Thus, when the payload field is expanded, the coded control words are re-coded to yield 8-bit control words. Additionally, when the start of the packet or the end of the packet appears in the payload field, a start-of-packet control word or an end-of-packet control word, respectively, is inserted into the payload field. As noted above, the TYPE word indicates what portion of the payload field is occupied by coded control words, and the location in the payload field of the start of the packet or the end of packet. The processing performed in process 276 will be described in more detail below with reference to FIG. 9B. Execution then advances to process 277.

In process 277 the payload field is adopted as a block of received data.

In process 278, a test is performed to determine whether all frames have been processed. When the test result is YES, execution advances to process 279, where it ends. When the test result is NO, execution returns to process 272 via process 280 so that the next frame can be processed.

Process 276 of the method described above with reference to FIG. 9A will now be described with reference to FIG. 9B.

Figure 9B:
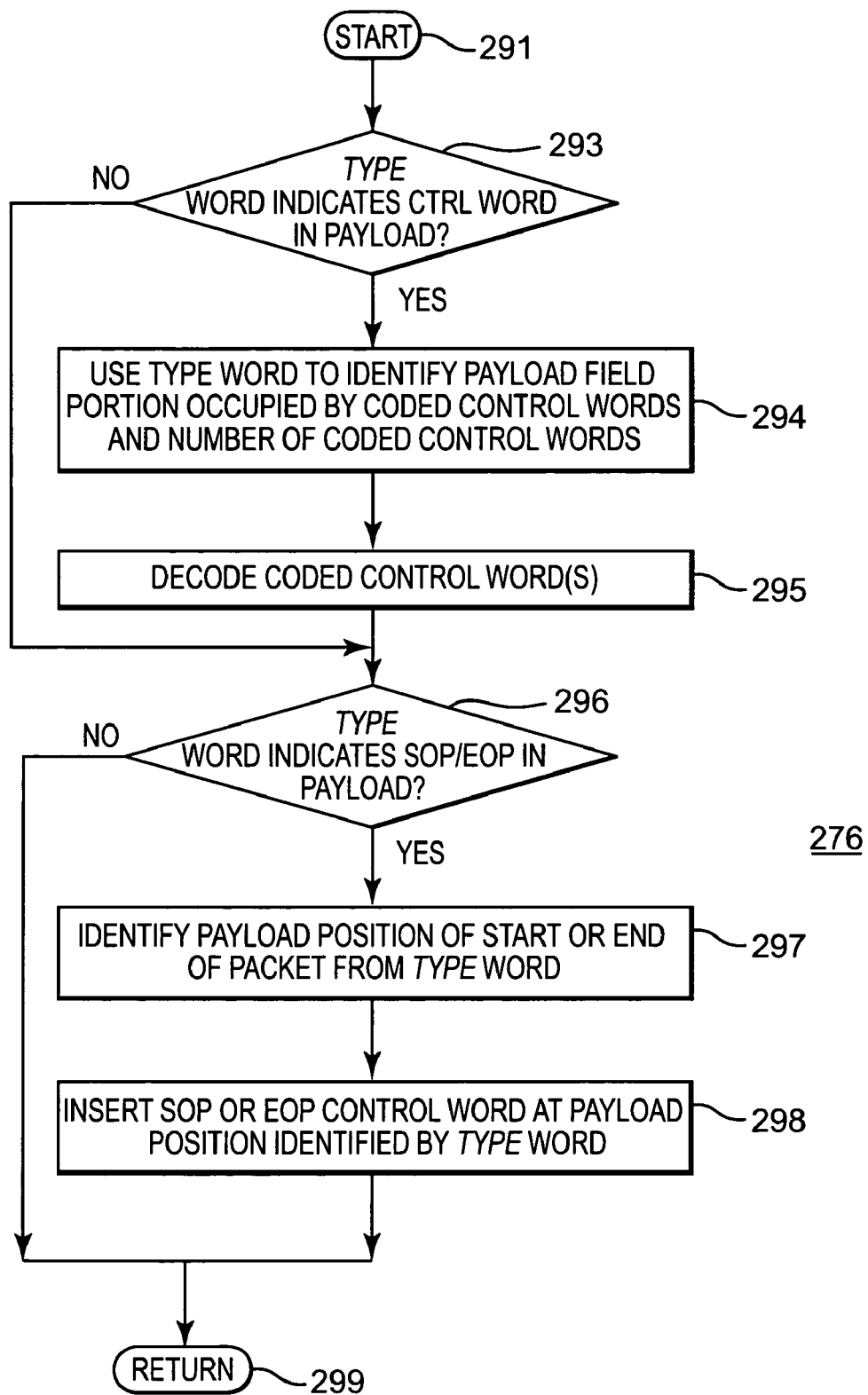
FIG. 9B is a flow chart showing an example of the processing performed in process 276 of the method shown in FIG. 9A according to one embodiment of the invention.

FIG. 9B is a flow chart showing an example of the processing performed in process 276 of the method shown in FIG. 9A according to one embodiment of the invention.

Execution starts in process 291.

In process 293, a test is performed to determine whether the TYPE word indicates that any coded control words appear in the payload field, i.e., whether the encoder 100 derived the payload field from a Type 2 block or a Type 4 through Type 11 block. When the test result is NO, execution advances to process 296, which will be described below. When the test result is YES, execution advances to process 294.

In process 294, the TYPE word is used to identify the portion of the payload field occupied by one or more coded control words, and the number of coded control words. It can be seen from FIGS. 7A-7L that the coded control words in the frame derived from each block Type differ in number but are always contiguous. However, in some frames, the coded control words abut the head of the payload field, whereas in others, the coded control words abut the end of the payload field.

In process 295, the coded control words identified by process 294 are decoded to yield the original control words.

In process 296, a test is performed to determine whether the TYPE word indicates that a packet starts or ends in the payload field, i.e., whether the encoder 100 derived the payload field from a Type 3 through Type 12 block. When the test result is NO, this indicates that the payload field was derived from a Type 2 block. In this case, execution advances to process 299, which will be described below. When the test result is YES, execution advances to process 297.

In process 297, the position of the start of the packet or the end of the packet in the payload field is identified from the TYPE word.

In process 298, an SOP control word S or an EOP control word T is inserted into the payload field. The control word inserted, i.e., whether the control word S or T is inserted, and the position in the payload field at which the SOP or EOP control word is inserted are defined by the TYPE word. Execution then advances to process 299.

In process 299, execution returns to the main routine.

Either or both of the control word decoding performed in process 295 and the control word insertion performed in process 298 insert 8-bit control words into the payload field. This fills the space in the payload field formerly occupied by the TYPE word and, in some frames, fill bits.

Figure 10A:
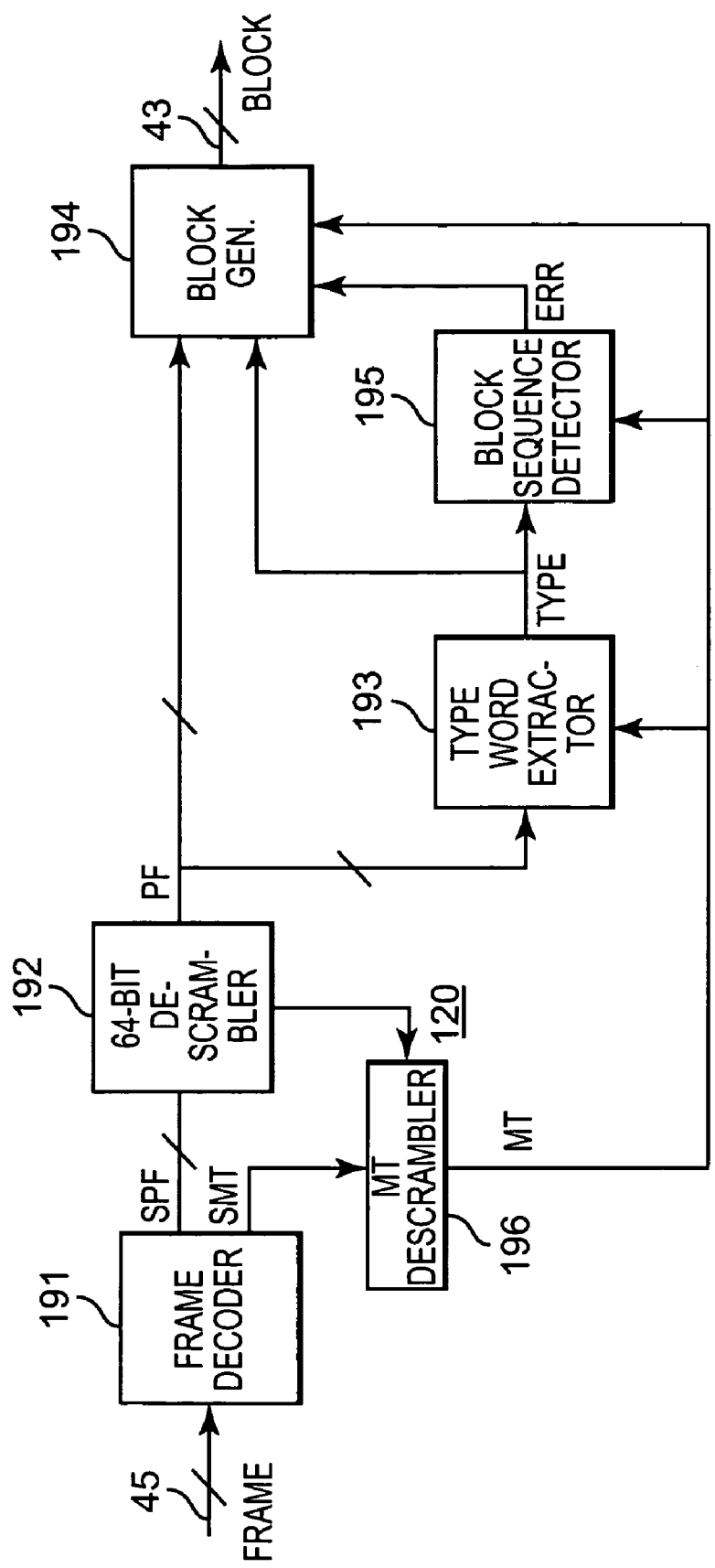
FIG. 10A is a block diagram showing a first embodiment of a decoder for decoding the frames generated by the coding method and coder according to the invention.

FIG. 10A is a block diagram showing a first embodiment of the decoder 120. The decoder 120 includes frame decoder 191, 64-bit parallel descrambler 192, type word extractor 193, block generator 194, block sequence detector 195, and master transition descrambler 196.

The frame decoder 191 receives each 66-bit frame from the demultiplexer 36 via the 66-bit bus 45 (FIG. 1). The frame decoder 191 reads the scrambled master transition SMT at the front of the frame and feeds the scrambled master transition SMT to the master transition descrambler 196. The frame decoder 191 feeds the remaining 64 bits constituting the scrambled payload field SPF of the frame to the descrambler 192.

The descrambler 192 is a self-synchronous polynomial descrambler that uses the same polynomial as was used by the scrambler 183 (FIG. 8A) in the encoder 100 to scramble the payload field. The descrambler 192 is preferably a parallel descrambler to reduce latency. The descrambler 192 descrambles the scrambled payload field SPF received from the frame decoder 191 and feeds the resulting payload field PF to the type word extractor 193 and the block generator 194. In a decoder specifically designed for decoding frames in which the payload field has not been scrambled, the descrambler 192 can be omitted.

The master transition descrambler 196 descrambles the scrambled master transition SMT received from frame decoder 191, using a descrambler bit provided by 64-bit descrambler 192, and thereby generates a (descrambled) master transition MT. The master transition descrambler 196 feeds the master transition MT to the type word extractor 193, the block sequence detector 195, and the block generator 194.

The type word extractor 193 receives the payload field PF from the descrambler 192 and additionally receives the master transition MT from the master transition descrambler 196. The type word extractor 193 operates only when the master transition is in its second state, corresponding to a frame whose payload field is not composed exclusively of information words. The type word extractor 193 extracts the TYPE word from the sub-field 157 of the payload field 152 (FIG. 4C) and feeds the TYPE word to the block generator 194 and the block sequence detector 195.

The block generator 194 receives the payload field PF from the descrambler 192, the TYPE word from the type word extractor 193 and the master transition MT from the master transition descrambler 196. The block generator 194 operates in response to the master transition. When the master transition is in the first state, the block generator 194 adopts the payload field PF as a block of received data. When the master transition is in the second state, the block generator 194 expands the payload field using the information provided by the type word regarding the structure of the payload field. Expanding the payload field reverses the condensing that was applied by the encoder 100 to the block from which the frame was generated. Thus, when the payload field is expanded, the coded control words are re-coded to yield 8-bit control words. Additionally, when the start of the packet or the end of the packet appears in the payload field, a start-of-packet control word or an end-of-packet control word, respectively, is inserted into the payload field. As noted above, the TYPE word indicates what portion of the payload field is occupied by coded control words, and the location in the payload field of the start of the packet or the end of packet. Finally, the block generator 194 adopts the payload field after expansion as the block of received data.

The block generator 194 feeds the block of received data to the 4x8b/10b encoder 38 via the bus 43 (FIG. 1).

The block sequence detector 195 receives the TYPE word from the type word extractor 193 and the master transition MT from the master transition descrambler 196. The master transition of a frame and the TYPE word of the frame, when present, collectively define what kind of frame the frame is.

As noted above, the frame can be one of four different kinds, namely, one composed exclusively of information words D (generated from Type 1 block), one that includes the start of a packet S (generated from Type 3 or Type 4 block), one that includes the end of a packet T (generated from one of Type 5 through Type 12 block) and one composed exclusively of control words Z (generated from Type 2 block). The encoder 100 generates the four different kinds of frames in a predetermined order, namely: S, D, . . . , D, T, Z, . . . , Z, S, D, . . . , D, T, Z, . . . , Z, etc. The frames must be received by the decoder 120 in the same predetermined order. The block sequence detector 195 monitors the order of the kinds of frames received, and generates the error flag ERR when the TYPE word and the master transition indicate that the frame is of a kind that violates the predetermined order. The block generator 194 adds the error control word E to the block of received data generated from the frame in response to the error signal. The error control word causes the MAC 12 (FIG. 1) to void the packet of which the block forms a part.

Figure 10B:
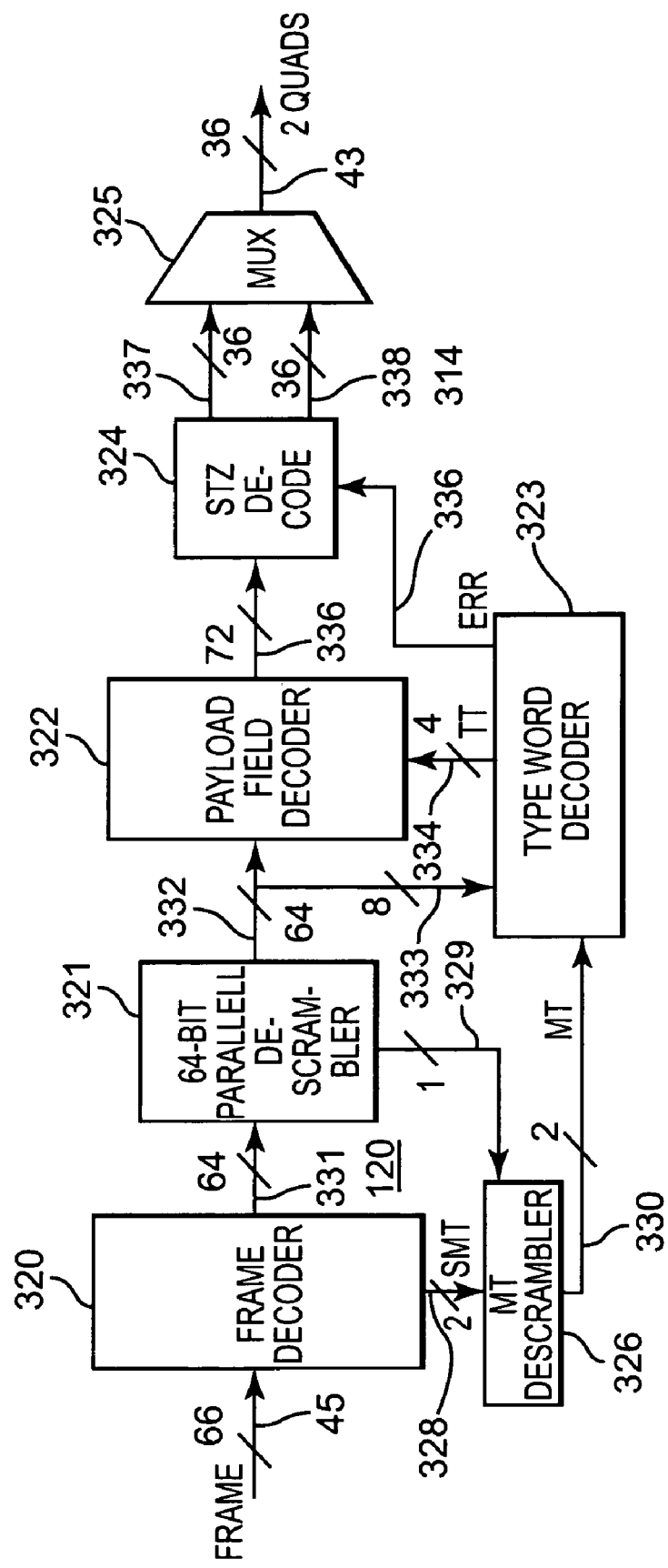
FIG. 10B is a block diagram showing a second embodiment of a decoder for decoding the frames generated by the coding method and coder according to the invention.

FIG. 10B is a block diagram showing a second embodiment of the decoder 120. The decoder 120 includes frame decoder 320, 64-bit parallel descrambler 321, payload field decoder 322, type word decoder 323, STZ decoder 324, multiplexer 325, and master transition descrambler 326.

The frame decoder 320 is connected by the 66-bit wide bus 45 to the output of the demultiplexer 36 (FIG. 1) from which it receives each frame recovered from the received bitstream. The frame decoder 320 reads the scrambled master transition SMT at the front of the frame and feeds the scrambled master transition SMT to the master transition descrambler 326 via the 2-bit bus 328. The frame decoder 320 feeds the remaining 64 bits constituting the scrambled payload field of the frame to the descrambler 321 via the 64-bit bus 331.

The descrambler 321 is a self-synchronous polynomial descrambler that uses the same polynomial as was used by the scrambler 307 (FIG. 8B) in the encoder 100 to scramble the payload field. The descrambler 321 is preferably a parallel descrambler to reduce latency. The descrambler 321 descrambles the scrambled payload field received from the frame decoder 320 and feeds the resulting payload field to the payload field decoder 322 via the 64-bit bus 332. Additionally, the 8 bits closest to the head of the payload field output by the descrambler 321, i.e., the bits that represent the TYPE word when the TYPE word is present in the payload field 152 (FIG. 4A), are fed additionally to the type word decoder 323 via the 8-bit bus 333.

The master transition descrambler 326 descrambles the scrambled master transition SMT received from the frame decoder 320, using a descrambler bit provided by 64-bit descrambler 321 via 1-bit bus 329, and thereby generates a (descrambled) master transition MT. The master transition descrambler 326 feeds the master transition MT to the type word decoder 323 via the 2-bit bus 330.

The type word decoder 323 receives the master transition MT from the master transition descrambler 326 and additionally receives 8-bit words, some of which are TYPE words, from the descrambler 321. When the master transition is 10, indicating that the payload field is not composed exclusively of information words, the 8-bit word received via the bus 333 is the TYPE word extracted from the payload field. The type word decoder 323 truncates the TYPE word to its first 4 bits and feeds the truncated TYPE word to the payload field decoder 322 via the 4-bit bus 334. Alternatively, the TYPE word may be used without truncation.

When the master transition is 01, indicating that the payload field is composed exclusively of information words, the type word decoder 323 performs no decoding of the 8-bit word received via the bus 333. Instead, the type word decoder generates an additional truncated TYPE word that indicates that the payload field is composed exclusively of information words. It should be noted that, even with the additional truncated TYPE word indicating a payload field composed exclusively of information words, the set of TYPE words is sufficiently small for the TYPE words to be reliably represented by a 4-bit code in the internal processing performed by the decoder.

The type word decoder 323 additionally includes a block sequence detector (not shown) similar to the block sequence detector 195 (FIG. 10A) described above. The block sequence detector uses the master transition MT and the TYPE words to track the order of the kinds of frames and sends an error signal ERR to the STZ decoder 324 via the connection 336 when the order of the kinds of frames deviates from the predetermined order described above.

The payload field decoder 322 receives the payload field from the descrambler 321 and additionally receives the corresponding truncated TYPE word from the type word decoder 323. The payload field decoder 322 examines the truncated TYPE word to determine the structure of the payload field, i.e., which data elements of the payload field are information words, which data elements are coded control words and the position of the start of a packet or the end of a packet (if any) in the payload field. In response to the structure defined by the truncated TYPE word, the payload field decoder 322 transfers the contents of the payload field to an eight-word, 64-bit block. A set of 64, three-input data selectors that operate in response to the TYPE word can be used for this.

When the TYPE word corresponds to a Type 3 through 12 block, the payload field decoder 322 inserts into the block a start-of-packet control word S or an end-of-packet control word T in the position in the block indicated by the truncated TYPE word. The payload field decoder 322 feeds the 64-bit block to the STZ decoder 324 via 64 of the 72 conductors of the bus 336. The payload field decoder 322 additionally feeds, via the remaining eight conductors of the bus 336, a set of eight control word flags for the block. The control word flags indicate whether each word in the block is an information word or a control word. The payload field decoder 322 selects the set of control word flags fed to the STZ decoder 324 with each block in response to the truncated TYPE word, because the block Type of the block defines whether each word of the block is an information word or a control word.

The STZ decoder 324 operates in response to the eight control word flags received together with the block from the payload field decoder 322. The STZ decoder 324 decodes the coding of each coded control word in the block to recover the original 8-bit control word. The words in the block subject to decoding are indicated by their respective control word flags indicating that the words are coded control words.

The STZ decoder 324 builds two quads by transferring the first four words of the block and their respective control word flags to the 36-bit bus 337, and by transferring the second four words of the block and their respective control word flags to the 36-bit bus 338. The busses 337 and 338 feed the quads and their control word flags in parallel to the multiplexer 325.

The multiplexer 325 alternately feeds the quads and their respective control word flags received via the busses 337 and 338 to the 4x8b/10b encoder 38 via the pseudo-XGMII bus 43.

In one embodiment, the descrambler 192 or 321 is also used to descramble the scrambled master transitions, and a separate master transition descrambler 196 or 326 is not used. In another form of the invention, the scrambled master transitions are descrambled with the master transition descrambler 196 or 326 by reusing one descrambler bit from the 64-bit payload descrambler 192 or 321 to perform pair-wise descrambling, wherein the one descrambler bit (e.g., the descrambler bit that is used to descramble the first bit of the payload field) is used to descramble both bits of the scrambled master transition. In this embodiment, descrambler 192 or 326 differs from a conventional descrambler in that scrambler 192 or 326 does not generate its own descrambler bits, and each bit to be descrambled is not descrambled with a different descrambler bit. In another embodiment of the invention, the master transition descrambler 196 or 326 is a separate self-synchronous descrambler that generates its own descrambler bits, and performs pair-wise descrambling of the scrambled master transitions. In one form of this embodiment, the separate self-synchronous descrambler 196 or 326 is a relatively short (e.g., 8-bit or 16-bit) descrambler.

The invention according to one embodiment provides a coder and coding method with a very low overhead when implemented as a 64b/66b code (3.125%). The overhead is substantially lower than 8b/10b (25%). The coder and coding method according to one form of the invention employ a self-synchronizing scrambler. Other coding schemes require periodic transmission of synchronization information and complex techniques to initialize non-self-synchronous scramblers. The coder and coding method according to one embodiment of the invention provide good error detection properties for 10 Gb/s Ethernet when the scrambler polynomial is specifically chosen not to interfere with the Ethernet-standard CRC-32 coding. The coder and coding method according to one form of the invention provide an excellent mean time to false packet acceptance (MTFPA) by choosing the TYPE words and the control words to have a 4-bit minimum Hamming distance. At a bit error rate of $10^{-9}$ and a bit rate of 10.3 Gb/s, the coder and coding method according to one embodiment have an MTFPA approximately equal to that of 1 Gb/s Ethernet, which uses 8b/10b line code, at a bit error rate of $10^{-11}$. The coder and coding method according to one form of the invention begin encoding as soon as enough information words are acquired—in particular, it is not required to buffer an entire Ethernet packet prior to transmission. The coder and coding method according to one embodiment of the invention allow Ethernet data to be transmitted at a bit rate of 10.0 Gb/s using existing lasers designed for use in SONET OC-192 transmitters. A 10 Gb/s Ethernet standard based on the coder and coding method according to one form of the invention can be adopted now rather than having to wait for lasers capable of modulation at 12.5 Gbaud to be developed. By scrambling and descrambling the master transitions according to one embodiment of the invention, the signal transition at the beginning of each frame is retained, and the spectral peaks caused by transmitting a repeating master transition pattern are eliminated.

Although this disclosure describes illustrative embodiments of the invention in detail, it is to be understood that the invention is not limited to the precise embodiments described, and that various modifications may be practiced within the scope of the invention defined by the appended claims. Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for coding a packet of information words into frames for transmission, the method comprising:
   receiving blocks of input data, the input data including control words and the packet of information words, the packet having a start preceded by ones of the control words and an ending followed by others of the control words, the blocks being smaller than the packet;
   determining when a block consists exclusively of information words;
   when the block consists exclusively of information words, scrambling a master transition having a first sense and appending the scrambled master transition to the block to form one of the frames;
   when the block does not consist exclusively of information words:
      condensing the block to accommodate a TYPE word;
      generating the TYPE word having a value that indicates a structural property of the block, and inserting the TYPE word into the block; and
      scrambling a master transition having a second sense, opposite to the first sense, and appending the scrambled master transition to the block to form one of the frames.

2. The method of claim 1, wherein the generated TYPE word has a value that indicates one of the following structural properties of the block: (a) a position of the start of the packet in the block, (b) a position of the end of the packet in the block, and (c) the block being composed exclusively of control words.

3. The method of claim 1, and further comprising:
   recoverably scrambling the block prior to transmission of the block.

4. The method of claim 1, wherein the master transition is a 2-bit value of either 01 or 10.

5. The method of claim 4, wherein both bits of the master transition are scrambled based on a single scrambler bit, and wherein the scrambled master transition is a 2-bit value of either 01 or 10.

6. A coder for coding blocks of input data into respective frames for transmission, the input data including control words and a packet of information words, the packet having a start preceded by ones of the control words and an ending followed by others of the control words, the blocks being smaller than the packet, the coder comprising:
   a type word generator that receives a block and generates a TYPE word for the block, the TYPE word having a value that indicates a structural property of the block;
   a master transition generator that operates in response to the TYPE word and generates a master transition in a first sense when the TYPE word indicates that the block is composed exclusively of information words, and otherwise generates the master transition in a second sense, opposite to the first sense;
   a first scrambler that scrambles the master transition, thereby forming a scrambled master transition;
   a payload field generator that operates in response to the TYPE word and that adopts the block to form a payload field of a frame corresponding to the block when the TYPE word indicates that the block is composed exclusively of information words, and that otherwise condenses the block and inserts the TYPE word into the block to form the payload field; and
   a frame assembler that appends the scrambled master transition to the payload field to form the frame.

7. The coder of claim 6, wherein the generated TYPE word has a value that indicates one of the following structural properties of the block: (a) whether the block is composed exclusively of information words, (b) a position of the start of the packet in the block, (c) a position of the end of the packet in the block, and (d) whether the block is composed exclusively of control words.

8. The coder of claim 6, wherein the first scrambler is also configured to scramble the payload field.

9. The coder of claim 6, and further comprising a second scrambler interposed between the payload field generator and the frame assembler for scrambling the payload field.

10. The coder of claim 9, wherein the first scrambler is a 16-bit scrambler.

11. The coder of claim 9, wherein the first scrambler is an 8-bit scrambler.

12. The coder of claim 6, wherein the master transition is a 2-bit value of either 01 or 10, wherein both bits of the master transition are scrambled based on a single scrambler bit, and wherein the scrambled master transition is a 2-bit value of either 01 or 10.

13. The coder of claim 12, wherein the scrambler bit is provided by a second scrambler that scrambles the payload field.

* * * * *